US006916412B2

(12) United States Patent
Woodruff et al.

(10) Patent No.: US 6,916,412 B2
(45) Date of Patent: Jul. 12, 2005

(54) ADAPTABLE ELECTROCHEMICAL PROCESSING CHAMBER

(75) Inventors: Daniel J. Woodruff, Kalispell, MT (US); Kyle M. Hanson, Kalispell, MT (US); Steve L. Eudy, Bigfork, MT (US); Curtis A. Weber, Columbia Falls, MT (US); Randy Harris, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 612 days.

(21) Appl. No.: 09/875,365

(22) Filed: Jun. 5, 2001

(65) Prior Publication Data

US 2001/0032788 A1 Oct. 25, 2001

Related U.S. Application Data

(63) Continuation-in-part of application No. 09/804,697, filed on Mar. 12, 2001, now Pat. No. 6,660,137, which is a continuation of application No. PCT/US00/10120, filed on Apr. 13, 2000.
(60) Provisional application No. 60/129,055, filed on Apr. 13, 1999.

(51) Int. Cl.[7] .............................. C25D 7/12; C25D 21/00
(52) U.S. Cl. .............................. 205/97; 205/80; 205/96; 205/123; 205/261; 205/640; 205/687
(58) Field of Search ............................. 205/80, 81, 96, 205/97, 123, 157, 261, 640, 687; 204/DIG. 13

(56) References Cited

U.S. PATENT DOCUMENTS

| 1,526,644 | A | 2/1925 | Pinney |
| 1,881,713 | A | 10/1932 | Laukel |
| 3,309,263 | A | 3/1967 | Grobe |
| 3,616,284 | A | 10/1971 | Bodmer et al. |
| 3,664,933 | A | 5/1972 | Clauss |

(Continued)

FOREIGN PATENT DOCUMENTS

| CA | 873651 | 6/1971 |
| DE | 41 14 427 | 11/1992 |
| DE | 195 25 666 | 10/1996 |
| EP | 0 140 404 A1 | 8/1984 |
| EP | 0047132 B1 | 7/1985 |
| EP | 0 677 612 A3 | 10/1985 |
| EP | 0 257 670 | 3/1988 |
| EP | 0290210 | 11/1988 |
| EP | 0 290 210 | 11/1988 |
| EP | 0582019 B1 | 10/1995 |

(Continued)

OTHER PUBLICATIONS

U.S. Appl. No. 08/940,524, filed Sep. 30, 1997, Bleck et al.
U.S. Appl. No. 08/990,107, filed Dec. 15, 1997, Hanson et al.

(Continued)

*Primary Examiner*—Roy King
*Assistant Examiner*—William T. Leader
(74) *Attorney, Agent, or Firm*—Perkins Coie LLP

(57) ABSTRACT

An electrochemical processing chamber which can be modified for treating different workpieces and methods for so modifying electrochemical processing chambers. In one particular embodiment, an electrochemical processing chamber 200 includes a plurality of walls 510 defining a plurality of electrode compartments 520, each electrode compartment having at least one electrode 600 therein, and a virtual electrode unit 530 defining a plurality of flow conduits, with at least one of the flow conduits being in fluid communication with each of the electrode compartments. This first virtual electrode unit 530 may be exchanged for a second virtual electrode unit 540, without modification of any of the electrodes 600, to adapt the processing chamber 200 for treating a different workpiece.

20 Claims, 14 Drawing Sheets

U.S. PATENT DOCUMENTS

| | | |
|---|---|---|
| 3,706,635 A | 12/1972 | Kowalski |
| 3,706,651 A | 12/1972 | Leland |
| 3,716,462 A | 2/1973 | Jensen |
| 3,798,003 A | 3/1974 | Ensley et al. |
| 3,878,066 A | 4/1975 | Dettke et al. |
| 3,930,963 A | 1/1976 | Polichette et al. |
| 3,968,885 A | 7/1976 | Hassan et al. |
| 4,000,046 A | 12/1976 | Weaver |
| 4,022,679 A | 5/1977 | Koziol et al. |
| 4,030,015 A | 6/1977 | Herko et al. |
| 4,046,105 A | 9/1977 | Gomez |
| 4,072,557 A | 2/1978 | Schiel |
| 4,082,638 A | 4/1978 | Jumer |
| 4,113,577 A | 9/1978 | Ross et al. |
| 4,134,802 A | 1/1979 | Herr |
| 4,137,867 A | 2/1979 | Aigo |
| 4,165,252 A | 8/1979 | Gibbs |
| 4,170,959 A | 10/1979 | Aigo |
| 4,222,834 A | 9/1980 | Bacon et al. |
| 4,238,310 A | 12/1980 | Eckler et al. |
| 4,246,088 A | 1/1981 | Murphy et al. |
| 4,259,166 A | 3/1981 | Whitehurst |
| 4,287,029 A | 9/1981 | Shimamura |
| 4,304,641 A | 12/1981 | Grandia et al. |
| 4,323,433 A | 4/1982 | Loch |
| 4,341,629 A | 7/1982 | Uhlinger |
| 4,360,410 A | 11/1982 | Fletcher et al. |
| 4,378,283 A | 3/1983 | Seyffert |
| 4,384,930 A | 5/1983 | Eckles |
| 4,391,694 A | 7/1983 | Runsten |
| 4,422,915 A | 12/1983 | Wielonski et al. |
| 4,431,361 A | 2/1984 | Bayne |
| 4,437,943 A | 3/1984 | Beck et al. |
| 4,440,597 A | 4/1984 | Wells et al. |
| 4,443,117 A | 4/1984 | Muramoto et al. |
| 4,449,885 A | 5/1984 | Hertel et al. |
| 4,451,197 A | 5/1984 | Lange |
| 4,463,503 A | 8/1984 | Applegate |
| 4,466,864 A | 8/1984 | Bacon |
| 4,469,566 A | 9/1984 | Wray |
| 4,475,823 A | 10/1984 | Stone |
| 4,480,028 A | 10/1984 | Kato et al. |
| 4,495,153 A | 1/1985 | Midorikawa |
| 4,495,453 A | 1/1985 | Inaba |
| 4,500,394 A | 2/1985 | Rizzo |
| 4,529,480 A | 7/1985 | Trokhan |
| 4,541,895 A | 9/1985 | Albert |
| 4,566,847 A | 1/1986 | Maeda |
| 4,576,685 A | 3/1986 | Goffredo et al. |
| 4,576,689 A | 3/1986 | Makkaev et al. |
| 4,585,539 A | 4/1986 | Edson |
| 4,604,177 A | 8/1986 | Sivilotti |
| 4,604,178 A | 8/1986 | Fiegener |
| 4,634,503 A | 1/1987 | Nogavich |
| 4,639,028 A | 1/1987 | Olson |
| 4,648,944 A | 3/1987 | George et al. |
| 4,670,126 A | 6/1987 | Messer et al. |
| 4,685,414 A | 8/1987 | DiRico |
| 4,687,552 A | 8/1987 | Early et al. |
| 4,693,017 A | 9/1987 | Oehler et al. |
| 4,696,729 A | 9/1987 | Santini |
| 4,715,934 A | 12/1987 | Tamminen |
| 4,741,624 A | 5/1988 | Barroyer |
| 4,760,671 A | 8/1988 | Ward |
| 4,761,214 A | 8/1988 | Hinman |
| 4,770,590 A | 9/1988 | Hugues et al. |
| 4,781,800 A | 11/1988 | Goldman et al. |
| 4,800,818 A | 1/1989 | Kawaguchi et al. |
| 4,828,654 A | 5/1989 | Reed |
| 4,849,054 A | 7/1989 | Klowak |
| 4,858,539 A | 8/1989 | Schumann |
| 4,864,239 A | 9/1989 | Casarcia et al. |
| 4,868,992 A | 9/1989 | Crafts et al. |
| 4,898,647 A | 2/1990 | Luce et al. |
| 4,902,398 A | 2/1990 | Homstad |
| 4,906,341 A | 3/1990 | Yamakawa |
| 4,913,085 A | 4/1990 | Vohringer et al. |
| 4,924,890 A | 5/1990 | Giles et al. |
| 4,944,650 A | 7/1990 | Matsumoto |
| 4,949,671 A | 8/1990 | Davis et al. |
| 4,951,601 A | 8/1990 | Maydan et al. |
| 4,959,278 A | 9/1990 | Shimauchi et al. |
| 4,962,726 A | 10/1990 | Matsushita et al. |
| 4,979,464 A | 12/1990 | Kunze-Concewitz et al. |
| 4,988,533 A | 1/1991 | Freeman et al. |
| 5,000,827 A | 3/1991 | Schuster et al. |
| 5,024,746 A | 6/1991 | Stierman et al. |
| 5,026,239 A | 6/1991 | Chiba |
| 5,048,589 A | 9/1991 | Cook et al. |
| 5,054,988 A | 10/1991 | Shiraiwa |
| 5,055,036 A | 10/1991 | Asano et al. |
| 5,061,144 A | 10/1991 | Akimoto |
| 5,069,548 A | 12/1991 | Boehnlein |
| 5,078,852 A | 1/1992 | Yee |
| 5,083,364 A | 1/1992 | Olbrich et al. |
| 5,096,550 A | 3/1992 | Mayer et al. |
| 5,110,248 A | 5/1992 | Asano et al. |
| 5,115,430 A | 5/1992 | Hahne et al. |
| 5,125,784 A | 6/1992 | Asano |
| 5,128,912 A | 7/1992 | Hug et al. |
| 5,135,636 A | 8/1992 | Yee et al. |
| 5,138,973 A | 8/1992 | Davis et al. |
| 5,146,136 A | 9/1992 | Ogura |
| 5,151,168 A | 9/1992 | Gilton et al. |
| 5,155,336 A | 10/1992 | Gronet et al. |
| 5,156,174 A | 10/1992 | Thompson |
| 5,156,730 A | 10/1992 | Bhatt et al. |
| 5,168,886 A | 12/1992 | Thompson et al. |
| 5,168,887 A | 12/1992 | Thompson |
| 5,169,408 A | 12/1992 | Biggerstaff et al. |
| 5,172,803 A | 12/1992 | Lewin |
| 5,174,045 A | 12/1992 | Thompson et al. |
| 5,178,512 A | 1/1993 | Skrobak |
| 5,178,639 A | 1/1993 | Nishi |
| 5,180,273 A | 1/1993 | Saiaya et al. |
| 5,183,377 A | 2/1993 | Becker et al. |
| 5,186,594 A | 2/1993 | Toshima et al. |
| 5,209,817 A | 5/1993 | Ahmad et al. |
| 5,217,586 A | 6/1993 | Datta et al. |
| 5,222,310 A | 6/1993 | Thompson |
| 5,227,041 A | 7/1993 | Brogden |
| 5,228,232 A | 7/1993 | Miles |
| 5,228,966 A | 7/1993 | Murata |
| 5,230,371 A | 7/1993 | Lee |
| 5,232,511 A | 8/1993 | Bergman |
| 5,235,995 A | 8/1993 | Bergman et al. |
| 5,238,500 A | 8/1993 | Bergman |
| 5,252,137 A | 10/1993 | Tateyama et al. |
| 5,252,807 A | 10/1993 | Chizinsky |
| 5,256,262 A | 10/1993 | Blomsterberg |
| 5,256,274 A | 10/1993 | Poris |
| 5,271,953 A | 12/1993 | Litteral |
| 5,271,972 A | 12/1993 | Kwok et al. |
| 5,301,700 A | 4/1994 | Kamikawa et al. |
| 5,302,464 A | 4/1994 | Nomura et al. |
| 5,306,895 A | 4/1994 | Ushikoshi et al. |
| 5,314,294 A | 5/1994 | Taniguchi |
| 5,316,642 A | 5/1994 | Young |
| 5,326,455 A | 7/1994 | Kubo et al. |
| 5,330,604 A | 7/1994 | Allum et al. |
| 5,332,271 A | 7/1994 | Grant et al. |

| | | | | | |
|---|---|---|---|---|---|
| 5,332,445 A | 7/1994 | Bergman | 5,700,127 A | 12/1997 | Harada |
| 5,340,456 A | 8/1994 | Mehler | 5,711,646 A | 1/1998 | Ueda et al. |
| 5,344,491 A | 9/1994 | Katou | 5,723,028 A | 3/1998 | Poris |
| 5,348,620 A | 9/1994 | Hermans et al. | 5,731,678 A | 3/1998 | Zila et al. |
| 5,364,504 A | 11/1994 | Smurkoski et al. | 5,744,019 A | 4/1998 | Ang |
| 5,366,785 A | 11/1994 | Sawdai | 5,746,565 A | 5/1998 | Tepolt |
| 5,366,786 A | 11/1994 | Connor et al. | 5,747,098 A | 5/1998 | Larson |
| 5,368,711 A | 11/1994 | Poris | 5,754,842 A | 5/1998 | Minagawa |
| 5,372,848 A | 12/1994 | Blackwell et al. | 5,755,948 A | 5/1998 | Lazaro et al. |
| 5,376,176 A | 12/1994 | Kuriyama | 5,759,006 A | 6/1998 | Miyamoto et al. |
| 5,377,708 A | 1/1995 | Bergman et al. | 5,762,751 A | 6/1998 | Bleck |
| 5,388,945 A | 2/1995 | Garric et al. | 5,765,444 A | 6/1998 | Bacchi |
| 5,391,285 A | 2/1995 | Lytle et al. | 5,765,889 A | 6/1998 | Nam et al. |
| 5,391,517 A | 2/1995 | Gelatos et al. | 5,776,327 A | 7/1998 | Botts et al. |
| 5,405,518 A | 4/1995 | Hsieh et al. | 5,785,826 A | 7/1998 | Greenspan |
| 5,411,076 A | 5/1995 | Matsunaga et al. | 5,788,829 A | 8/1998 | Joshi et al. |
| 5,421,987 A | 6/1995 | Tzanavaras et al. | 5,802,856 A | 9/1998 | Schaper et al. |
| 5,427,674 A | 6/1995 | Langenskiold et al. | 5,829,791 A | 11/1998 | Kotsubo et al. |
| 5,429,686 A | 7/1995 | Chiu et al. | 5,843,296 A | 12/1998 | Greespan |
| 5,429,733 A | 7/1995 | Ishida | 5,871,626 A | 2/1999 | Crafts et al. |
| 5,431,803 A | 7/1995 | DiFranco et al. | 5,871,805 A | 2/1999 | Lemelson |
| 5,437,777 A | 8/1995 | Kishi | 5,882,498 A | 3/1999 | Dubin et al. |
| 5,441,629 A | 8/1995 | Kosaki | 5,892,207 A | 4/1999 | Kawamura et al. |
| 5,442,416 A | 8/1995 | Tateyama et al. | 5,904,827 A | 5/1999 | Reynolds |
| 5,443,707 A | 8/1995 | Mori | 5,908,543 A | 6/1999 | Matsunami et al. |
| 5,445,484 A | 8/1995 | Kato et al. | 5,925,227 A | 7/1999 | Kobayashi et al. |
| 5,447,615 A | 9/1995 | Ishida | 5,932,077 A | 8/1999 | Reynolds |
| 5,454,405 A | 10/1995 | Hawes | 5,937,142 A | 8/1999 | Moslehi et al. |
| 5,460,478 A | 10/1995 | Akimoto et al. | 5,957,836 A | 9/1999 | Johnson |
| 5,464,313 A | 11/1995 | Ohsawa | 5,980,706 A | 11/1999 | Bleck |
| 5,472,502 A | 12/1995 | Batchelder | 5,985,126 A | 11/1999 | Bleck |
| 5,489,341 A | 2/1996 | Bergman et al. | 5,989,397 A | 11/1999 | Laube et al. |
| 5,500,081 A | 3/1996 | Bergman | 5,989,406 A | 11/1999 | Beetz, Jr. et al. |
| 5,501,768 A | 3/1996 | Hermans et al. | 5,998,123 A | 12/1999 | Tanaka et al. |
| 5,508,095 A | 4/1996 | Allum et al. | 5,999,886 A | 12/1999 | Martin et al. |
| 5,512,319 A | 4/1996 | Cook et al. | 6,001,235 A | 12/1999 | Arken et al. |
| 5,514,258 A | 5/1996 | Brinket et al. | 6,004,828 A | 12/1999 | Hanson |
| 5,516,412 A | 5/1996 | Andricacos et al. | 6,017,820 A | 1/2000 | Ting et al. |
| 5,522,975 A | 6/1996 | Andricacos et al. | 6,027,631 A | 2/2000 | Broadbent |
| 5,527,390 A | 6/1996 | Ono et al. | 6,028,986 A | 2/2000 | Song |
| 5,544,421 A | 8/1996 | Thompson et al. | 6,051,284 A | 4/2000 | Byrne et al. |
| 5,549,808 A | 8/1996 | Farooq et al. | 6,053,687 A | 4/2000 | Kirkpatrick |
| 5,567,267 A | 10/1996 | Kazama et al. | 6,072,160 A | 6/2000 | Bahl |
| 5,571,325 A | 11/1996 | Ueyama et al. | 6,072,163 A | 6/2000 | Armstrong et al. |
| 5,575,611 A | 11/1996 | Thompson et al. | 6,074,544 A | 6/2000 | Reid et al. |
| 5,584,310 A | 12/1996 | Bergman | 6,080,288 A | 6/2000 | Schwartz et al. |
| 5,584,971 A | 12/1996 | Komino | 6,080,291 A | 6/2000 | Woodruff et al. |
| 5,593,545 A | 1/1997 | Rugowski et al. | 6,080,691 A | 6/2000 | Lindsay et al. |
| 5,597,460 A | 1/1997 | Reynolds | 6,086,680 A | 7/2000 | Foster et al. |
| 5,597,836 A | 1/1997 | Hackler et al. | 6,090,260 A | 7/2000 | Inoue et al. |
| 5,600,532 A | 2/1997 | Michiya et al. | 6,091,498 A | 7/2000 | Hanson |
| 5,609,239 A | 3/1997 | Schlecker | 6,099,702 A | 8/2000 | Reid |
| 5,620,581 A | 4/1997 | Ang | 6,099,712 A | 8/2000 | Ritzdorf |
| 5,639,206 A | 6/1997 | Oda et al. | 6,103,085 A | 8/2000 | Woo et al. |
| 5,639,316 A | 6/1997 | Cabral, Jr. et al. | 6,107,192 A | 8/2000 | Subrahmanyan et al. |
| 5,641,613 A | 6/1997 | Boff et al. | 6,108,937 A | 8/2000 | Raaijmakers |
| 5,650,082 A | 7/1997 | Anderson | 6,110,011 A | 8/2000 | Somekh |
| 5,651,823 A | 7/1997 | Parodi et al. | 6,110,346 A | 8/2000 | Reid et al. |
| 5,658,387 A | 8/1997 | Reardon | 6,130,415 A | 10/2000 | Knoot |
| 5,660,472 A | 8/1997 | Peuse et al. | 6,136,163 A | 10/2000 | Cheung |
| 5,660,517 A | 8/1997 | Thompson et al. | 6,139,703 A | 10/2000 | Hanson et al. |
| 5,662,788 A | 9/1997 | Sandhu | 6,139,712 A | 10/2000 | Patton |
| 5,664,337 A | 9/1997 | Davis et al. | 6,140,234 A | 10/2000 | Uzoh et al. |
| 5,670,034 A | 9/1997 | Lowery | 6,143,147 A | 11/2000 | Jelinek |
| 5,676,337 A | 10/1997 | Giras et al. | 6,143,155 A | 11/2000 | Adams |
| 5,677,118 A | 10/1997 | Spara et al. | 6,151,532 A | 11/2000 | Barone et al. |
| 5,678,320 A | 10/1997 | Thompson et al. | 6,156,167 A | 12/2000 | Patton et al. |
| 5,681,392 A | 10/1997 | Swain | 6,157,106 A | 12/2000 | Tietz et al. |
| 5,683,564 A | 11/1997 | Reynolds | 6,159,354 A | 12/2000 | Contolini et al. |
| 5,684,654 A | 11/1997 | Searle et al. | 6,162,344 A | 12/2000 | Reid et al. |
| 5,684,713 A | 11/1997 | Asada et al. | 6,162,488 A | 12/2000 | Gevelber et al. |

| | | |
|---|---|---|
| 6,168,695 B1 | 1/2001 | Woodruff |
| 6,174,425 B1 | 1/2001 | Simpson |
| 6,174,796 B1 | 1/2001 | Takagi et al. |
| 6,179,983 B1 | 1/2001 | Reid et al. |
| 6,184,068 B1 | 2/2001 | Ohtani et al. |
| 6,193,859 B1 | 2/2001 | Contolini |
| 6,199,301 B1 | 3/2001 | Wallace |
| 6,218,097 B1 | 4/2001 | Bell et al. |
| 6,221,230 B1 | 4/2001 | Takeuchi |
| 6,228,232 B1 | 5/2001 | Woodruff et al. |
| 6,234,738 B1 | 5/2001 | Kimata |
| 6,251,238 B1 | 6/2001 | Kaufman et al. |
| 6,251,528 B1 | 6/2001 | Uzoh et al. |
| 6,254,742 B1 | 7/2001 | Hanson et al. |
| 6,258,220 B1 | 7/2001 | Dordi |
| 6,261,433 B1 | 7/2001 | Landau |
| 6,270,647 B1 | 8/2001 | Graham |
| 6,277,263 B1 | 8/2001 | Chen |
| 6,278,089 B1 | 8/2001 | Young et al. |
| 6,280,183 B1 | 8/2001 | Mayur et al. |
| 6,280,582 B1 | 8/2001 | Woodruff et al. |
| 6,280,583 B1 | 8/2001 | Woodruff et al. |
| 6,297,154 B1 | 10/2001 | Gross et al. |
| 6,303,010 B1 | 10/2001 | Woodruff et al. |
| 6,309,520 B1 | 10/2001 | Woodruff et al. |
| 6,309,524 B1 | 10/2001 | Woodruff et al. |
| 6,318,951 B1 | 11/2001 | Schmidt et al. |
| 6,322,112 B1 | 11/2001 | Duncan |
| 6,322,677 B1 | 11/2001 | Woodruff |
| 6,342,137 B1 | 1/2002 | Woodruff |
| 6,365,729 B1 | 4/2002 | Tyagi |
| 6,391,166 B1 | 5/2002 | Wang |
| 6,402,923 B1 | 6/2002 | Mayer |
| 6,409,892 B1 | 6/2002 | Woodruff et al. |
| 6,428,660 B2 | 8/2002 | Woodruff et al. |
| 6,428,662 B1 | 8/2002 | Woodruff et al. |
| 6,444,101 B1 | 9/2002 | Stevens |
| 6,471,913 B1 | 10/2002 | Weaver et al. |
| 6,481,956 B1 | 11/2002 | Hofmeister |
| 6,491,806 B1 | 12/2002 | Dubin |
| 6,497,801 B1 | 12/2002 | Woodruff et al. |
| 6,562,421 B2 | 5/2003 | Sudo |
| 6,565,729 B2 | 5/2003 | Chen |
| 6,569,297 B2 | 5/2003 | Wilson |
| 6,599,412 B1 | 7/2003 | Graham |
| 6,623,609 B2 | 9/2003 | Harris et al. |
| 6,632,334 B2 | 10/2003 | Anderson et al. |
| 6,660,137 B2 | 12/2003 | Wilson |
| 6,678,055 B2 | 1/2004 | Du-Nour et al. |
| 6,699,373 B2 | 3/2004 | Woodruff |
| 6,709,562 B1 | 3/2004 | Andricacos |
| 6,755,954 B2 | 6/2004 | Mayer et al. |
| 6,773,571 B1 | 8/2004 | Mayer et al. |
| 2001/0024611 A1 | 9/2001 | Woodruff et al. |
| 2001/0032788 A1 | 10/2001 | Woodruff |
| 2001/0043856 A1 | 11/2001 | Woodruff et al. |
| 2002/0008036 A1 | 1/2002 | Wang |
| 2002/0008037 A1 | 1/2002 | Wilson et al. |
| 2002/0032499 A1 | 3/2002 | Wilson et al. |
| 2002/0046952 A1 | 4/2002 | Graham |
| 2002/0079215 A1 | 6/2002 | Wilson et al. |
| 2002/0096508 A1 | 7/2002 | Weaver et al. |
| 2002/0125141 A1 | 9/2002 | Wilson et al. |
| 2002/0139678 A1 | 10/2002 | Wilson et al. |
| 2003/0038035 A1 | 2/2003 | Wilson |
| 2003/0062258 A1 | 4/2003 | Woodruff |
| 2003/0070918 A1 | 4/2003 | Hanson |
| 2003/0127337 A1 | 7/2003 | Hanson et al. |
| 2004/0031693 A1 | 2/2004 | Chen |
| 2004/0055877 A1 | 3/2004 | Wilson |
| 2004/0099533 A1 | 5/2004 | Wilson |

FOREIGN PATENT DOCUMENTS

| | | |
|---|---|---|
| EP | 0 677 612 A2 | 10/1995 |
| EP | 0544311 B1 | 5/1996 |
| EP | 0 881 673 A2 | 5/1998 |
| EP | 0 982 771 A1 | 8/1999 |
| EP | 1 069 213 A2 | 7/2000 |
| EP | 0452939 B1 | 11/2000 |
| GB | 2217107 A | 3/1989 |
| GB | 2 254 288 A | 3/1992 |
| GB | 2 279 372 A | 6/1994 |
| JP | 1048442 | 2/1989 |
| JP | 4144150 | 5/1992 |
| JP | 4311591 | 11/1992 |
| JP | 5146984 | 6/1993 |
| JP | 5195183 A | 8/1993 |
| JP | 5211224 | 8/1993 |
| JP | 6017291 A | 1/1994 |
| JP | 6073598 A | 3/1994 |
| JP | 6224202 A | 8/1994 |
| JP | 7113159 A | 5/1995 |
| JP | 7197299 A | 8/1995 |
| JP | 10-083960 | 3/1998 |
| JP | 11036096 A | 2/1999 |
| JP | 11080993 A | 3/1999 |
| WO | WO-90/00476 | 1/1990 |
| WO | WO-91/04213 | 4/1991 |
| WO | WO-95/06326 | 3/1995 |
| WO | WO-95/20064 | 7/1995 |
| WO | WO-99/16936 | 4/1996 |
| WO | WO-99/25904 | 5/1999 |
| WO | WO-99/25905 | 5/1999 |
| WO | WO-99/40615 | 8/1999 |
| WO | WO-99/41434 | 8/1999 |
| WO | WO-99/45745 | 9/1999 |
| WO | WO-00/02675 | 1/2000 |
| WO | WO-00/02808 | 1/2000 |
| WO | WO-00/02808 A1 | 1/2000 |
| WO | WO-00/03072 | 1/2000 |
| WO | WO-02/02808 | 1/2000 |
| WO | WO-00/32835 | 6/2000 |
| WO | WO 00/61498 | 10/2000 |
| WO | WO 00/61837 | 10/2000 |
| WO | WO-01/46910 | 6/2001 |
| WO | WO 01/90434 | 11/2001 |
| WO | WO 01/91163 | 11/2001 |
| WO | WO-02/17203 | 2/2002 |
| WO | WO 02/045476 | 6/2002 |
| WO | WO-03/18874 | 9/2002 |
| WO | WO 02/97165 | 12/2002 |
| WO | WO-02/97165 | 12/2002 |
| WO | WO-02/99165 | 12/2002 |
| WO | WO 02/99165 | 12/2002 |

OTHER PUBLICATIONS

U.S. Appl. No. 09/114,105, filed Jul. 11, 1998, Woodruff et al.
U.S. Appl. No. 09/618,707, filed Jul. 18, 2000, Hanson et al.
U.S. Appl. No. 09/679,928, Woodruff et al.
U.S. Appl. No. 10/729,349, Klocke.
U.S. Appl. No. 10/729,357, Klocke.
U.S. Appl. No. 10/817,659, Wilson et al.
U.S. Appl. No. 60/129,055, McHugh.
U.S. Appl. No. 60/143,769, McHugh.
U.S. Appl. No. 60/182,160, McHugh et al.
U.S. Appl. No. 60/206,663, Wilson et al.
U.S. Appl. No. 60/294,690, Gibbons et al.
U.S. Appl. No. 60/316,597, Hanson.
U.S. Appl. No. 60/607,046, Klocke.

U.S. Appl. No. 60/607,460, Klocke.

Contolini et al., "Copper Electroplating Process for Sub–Half–Micron ULSI Structures," VMIC Conference 1995 ISMIC—04/95/0322, pp. 322–328, Jun. 17–29, 1995.

Devaraj et al., "Pulsed Electrodeposition of Copper," Plating & Surface Finishing, pp. 72–78, Aug. 1992.

Dubin, "Copper Plating Techniques for ULSI Metallization," Advanced MicroDevices, no date.

Dubin, V.M., "Electrochemical Deposition of Copper for On–Chip Interconnects," Advanced MicroDevices, no date.

Gauvin et al., "The Effect of Chloride Ions on Copper Deposition," J. of Electrochemical Society, vol. 99, pp. 71–75, Feb. 1952.

Lowenheim, Frederick A., "Electroplating Electrochemistry Applied to Electroplating," 1978, pp 152–155, McGraw–Hill Book Company, New York.

Ossro, N.M., "An Overview of Pulse Plating," Plating and Surface Finishing, Mar. 1986.

Passal, F., "Copper Plating During the Last Fifty Years," Plating, pp. 628–638, Jun. 1959.

Patent Abstract of Japan, "Partial Plating Device," Publication No. 01234590, Publication Date: Sep. 19, 1989.

Patent Abstract of Japan, "Plating Method" Publication No. 57171690, Publication Date: Oct. 22, 1982.

Singer, P., "Copper Goes Mainstream: Low k to Follow," Semiconductor International, pp. 67–70, Nov. 1997.

Patent Abstract of Japan, "Organic Compound and its Application," Publciation No. 08–003153, Publication Date: Jan. 9, 1996.

Patent Abstract of Japan, English Abstract Translation— Japanese Utility Model No. 2538705, Publication Date: Aug. 25, 1992.

Lee, Tien–Yu Tom, "Application of a CFD Tool in Designing a Fountain Plating Cell for Uniform Bump Plating of Semiconductor Wafers," IEE Transactions on Components, Packaging, and Manufacturing Technology (Feb. 1996), vol. 19, No. 1, IEEE.

Ritter et al., "Two– Three–Dimensional Numberical Modeling of Copper Electroplating For Advanced ULSI Metallization", E–MRS Conference Symposium M. Basic Models to Enhance Reliability, Strasbourg (France) 1999.

ADAPTABLE ELECTROCHEMICAL PROCESSING CHAMBER

CROSS-REFERENCE TO RELATED APPLICATIONS

This application is a continuation-in-part of U.S. application Ser. No. 09/804,697, entitled "SYSTEM FOR ELECTROCHEMICALLY PROCESSING A WORKPIECE," filed on Mar. 12, 2001 now U.S. Pat. No. 6,660,137; which is a continuation of International Application No. PCT/US00/10120, filed on Apr. 13, 2000, in the English language and published in the English language as International Publication No. WO00/61498, which claims the benefit of Provisional Application No. 60/129,055, filed on Apr. 13, 1999, all of which are herein incorporated by reference. Additionally, this application is related to the following:

(a) U.S. patent application entitled "TRANSFER DEVICES FOR HANDLING MICROELECTRONIC WORKPIECES WITHIN AN ENVIRONMENT OF A PROCESSING MACHINE AND METHODS OF MANUFACTURING AND USING SUCH DEVICES IN THE PROCESSING OF MICROELECTRONIC WORKPIECES," filed concurrently, as Ser. No. 09/875,300, now U.S. Pat. No. 6,752,584;

(b) U.S. patent application entitled "INTEGRATED TOOLS WITH TRANSFER DEVICES FOR HANDLING MICROELECTRONIC WORKPIECES," filed concurrently, as Ser. No. 09/875,428, now U.S. Pat. No. 6,749,390;

(c) U.S. patent application entitled "DISTRIBUTED POWER SUPPLIES FOR MICROELECTRONIC WORKPIECE PROCESSING TOOLS," filed concurrently, as Ser. No. 09/875,304, now U.S. Pat. No. 6,632,334;

(d) U.S. patent application entitled "APPARATUS AND METHODS FOR ELECTROCHEMICAL PROCESSING OF MICROELECTRONIC WORKPIECES," filed May 31, 2001, as Ser. No. 09/872,151;

(e) U.S. patent application entitled "LIFT AND ROTATE ASSEMBLY FOR USE IN A WORKPIECE PROCESSING STATION AND A METHOD OF ATTACHING THE SAME," filed concurrently, as Ser. No. 09/875,424, now U.S. Pat. No. 6,623,609;

(f) U.S. patent applications entitled "TUNING ELECTRODES USED IN A REACTOR FOR ELECTROCHEMICALLY PROCESSING A MICROELECTRONIC WORKPIECE," filed on May 4, 2001, and identified by U.S. application Ser. No. 09/849,505, and two additional applications filed on May 24, 2001, as Ser. Nos. 09/866,391 and 09/866,463.

All of the foregoing U.S. patent applications in paragraphs (a)–(f) above are herein incorporated by reference.

TECHNICAL FIELD

This application relates to reaction vessels and methods of making and using such vessels in electrochemical processing of microelectronic workpieces.

BACKGROUND

Microelectronic devices, such as semiconductor devices and field emission displays, are generally fabricated on and/or in microelectronic workpieces using several different types of machines ("tools"). Many such processing machines have a single processing station that performs one or more procedures on the workpieces. Other processing machines have a plurality of processing stations that perform a series of different procedures on individual workpieces or batches of workpieces. In a typical fabrication process, one or more layers of conductive materials are formed on the workpieces during deposition stages. The workpieces are then typically subjected to etching and/or polishing procedures (i.e., planarization) to remove a portion of the deposited conductive layers for forming electrically isolated contacts and/or conductive lines.

Plating tools that plate metals or other materials on the workpieces are becoming an increasingly useful type of processing machine. Electroplating and electroless plating techniques can be used to deposit copper, solder, permalloy, gold, silver, platinum and other metals onto workpieces for forming blanket layers or patterned layers. A typical copper plating process involves depositing a copper seed layer onto the surface of the workpiece using chemical vapor deposition (CVD), physical vapor deposition (PVD), electroless plating processes, or other suitable methods. After forming the seed layer, a blanket layer or patterned layer of copper is plated onto the workpiece by applying an appropriate electrical potential between the seed layer and an anode in the presence of an electroprocessing solution. The workpiece is then cleaned, etched and/or annealed in subsequent procedures before transferring the workpiece to another processing machine.

FIG. 1 illustrates an embodiment of a single-wafer processing station 1 that includes a container 2 for receiving a flow of electroplating solution from a fluid inlet 3 at a lower portion of the container 2. The processing station 1 can include an anode 4, a plate type diffuser 6 having a plurality of apertures 7, and a workpiece holder 9 for carrying a workpiece 5. The workpiece holder 9 can include a plurality of electrical contacts for providing electrical current to a seed layer on the surface of the workpiece 5. When the seed layer is biased with a negative potential relative to the anode 4, it acts as a cathode. In operation the electroplating fluid flows around the anode 4, through the apertures 7 in the diffuser 6 and against the plating surface of the workpiece 5. The electroplating solution is an electrolyte that conducts electrical current between the anode 4 and the cathodic seed layer on the surface of the workpiece 5. Therefore, ions in the electroplating solution plate the surface of the workpiece 5.

The plating machines used in fabricating microelectronic devices must meet many specific performance criteria. For example, many processes must be able to form small contacts in vias that are less than 0.5 $\mu$m wide, and are desirably less than 0.1 $\mu$m wide. The plated metal layers accordingly often need to fill vias or trenches that are on the order of 0.1 $\mu$m wide, and the layer of plated material should also be deposited to a desired, uniform thickness across the surface of the workpiece 5. One factor that influences the uniformity of the plated layer is the mass transfer of electroplating solution at the surface of the workpiece. This parameter is generally influenced by the velocity of the flow of the electroplating solution perpendicular to the surface of the workpiece. Another factor that influences the uniformity of the plated layer is the current density of the electrical field across the surface of the wafer.

One concern of existing electroplating equipment is providing a uniform mass transfer at the surface of the workpiece. Referring to FIG. 1, existing plating tools generally use the diffuser 6 to enhance the uniformity of the fluid flow perpendicular to the face of the workpiece. Although the diffuser 6 improves the uniformity of the fluid flow, it produces a plurality of localized areas of increased flow velocity perpendicular to the surface of the workpiece 5 (indicated by arrows 8). The localized areas generally correspond to the position of the apertures 7 in the diffuser 6. The increased velocity of the fluid flow normal to the substrate in the localized areas increases the mass transfer of the electroplating solution in these areas. This typically results in faster plating rates in the localized areas over the apertures 7. Although many different configurations of apertures have been used in plate-type diffusers, these diffusers may not provide adequate uniformity for the precision required in many current applications.

Existing plating tools are typically optimized for use with a single size of workpiece. Hence, the anode 4 and the diffuser 6 will have a size and shape which is specific to a particular size of workpiece. Using an anode 4 and diffuser 6 designed for one size of workpiece to process a differently sized workpieces 5 will yield inconsistent results. For example, a semiconductor wafer having a 150 mm diameter is small enough to fit in a processing station 1 designed for a 200 mm diameter wafer. Even if the workpiece holder 9 were modified to hold a 150 mm wafer, however, the flow patterns and electric field characteristics of the anode 4 and diffuser 6 designed for a 200 mm wafer would yield an uneven plating layer on the smaller 150 mm wafer.

As a result, adapting a processing station 1 to handle a differently sized workpiece 5 typically will require substantial modification. This will usually include replacing at least the anode 4 and diffuser 6. Replacing these parts is frequently more difficult and time consuming than the simple schematic diagram of FIG. 1 would imply. This requires stocking separate supplies of differently-sized anodes. If the anodes 4 are consumable, replacing them is complicated by the fact that they require maintenance of a passivated film layer for consistent operation. As a consequence, manufacturers typically optimize the processing station to process a single size workpiece and leave it unchanged. If the manufacturer wishes to produce two different sizes of workpieces, the manufacturer will commonly purchase an entirely separate processing machine so that each machine need only handle one size.

SUMMARY OF THE INVENTION

Various embodiments of the present invention provide electrochemical processing chambers and methods enabling a single electrochemical processing chamber to be used to treat different workpieces. Many of these embodiments permit a user to process different workpieces (e.g., a 200 mm semiconductor wafer and a 300 mm semiconductor wafer) in the same electrochemical processing chamber. For example, a processing chamber of the invention can include a virtual electrode unit defining virtual electrodes. Simply by replacing one virtual electrode unit for another in such an embodiment, the effective electrical field in the processing chamber can be modified. A further embodiment of the invention incorporates a virtual electrode unit in a field shaping unit which also includes one or more walls defining a separate compartment for each electrode. If so desired, such a field shaping unit may be replaced as a unit, further simplifying modification of the processing chamber. Certain embodiments of the invention provide methods which capitalize on the ease of replacing the virtual electrode units to thereby alter the electrical field in an electrochemical processing chamber to meet the processing needs for different workpieces.

One embodiment of the invention provides a method of modifying an electrochemical processing chamber from a first configuration for treating a first workpiece to a second configuration for treating a different second workpiece. The processing chamber initially includes a reaction vessel having a plurality of electrodes positioned in electrically separate electrode compartments and a first virtual electrode unit. The first virtual electrode unit defines a first set of virtual electrodes adapted for treating the first workpiece, each of the virtual electrodes being in fluid communication with one of the electrode compartments. The method includes providing a second virtual electrode unit which defines a second set of virtual electrodes adapted for treating the second workpiece. The relative positions of the virtual electrodes in the first set differ from the relative positions of the virtual electrodes in the second set. The first virtual electrode unit is replaced with the second virtual electrode unit, thereby modifying an effective electric field of the electrochemical processing chamber for treatment of the second workpiece without necessitating modification of the electrodes. This can extend the functionality of a processing line, enabling a manufacturer to readily process different types of workpieces in the same processing chamber rather than purchase a separate processing line dedicated to each type of workpiece.

In more particular aspects of this embodiment, the electrode compartments may be defined by a plurality of walls coupled to the first virtual electrode unit, with the walls and the first virtual electrode unit defining a first field shaping unit. With such a field shaping unit, replacing the first virtual electrode unit may comprise removing the first field shaping unit as a unit. The second virtual electrode unit may also include a plurality of walls coupled thereto to define a second field shaping unit, enabling the second field shaping unit to be installed as a unit. In a further embodiment, the first configuration of the processing chamber includes a first contact assembly adapted to support the first workpiece in a predetermined position with respect to the first set of virtual electrodes. This enables treatment of the first workpiece by defining an electrical potential between the electrodes and the first workpiece. The first contact assembly may also be replaced with a second contact assembly adapted to support the second workpiece and the second workpiece may be treated by defining an electrical potential between the electrodes and the second workpiece.

Another embodiment of the invention provides a method of effectuating electrochemical treatment of different first and second workpieces. This method includes providing an initial electrochemical processing chamber and a second virtual electrode unit. The initial processing chamber includes a reaction vessel having a plurality of electrodes in electrically separate electrode compartments and a first virtual electrode unit defining a first set of virtual electrodes. The second virtual electrode unit is adapted to define a second set of virtual electrodes, with relative positions of the virtual electrodes of the second virtual electrode unit being different from relative positions of the virtual electrodes of the first virtual electrode unit. A user is instructed to treat the first workpiece with the initial processing chamber; to replace the first virtual electrode unit with the second virtual electrode unit, thereby modifying the initial electrochemical processing chamber by repositioning the virtual electrodes; and to treat the second workpiece with the modified electrochemical processing chamber.

An alternative embodiment of the invention provides a method of effectuating assembly of an electrochemical processing chamber. In this method, a reaction vessel is provided, the reaction vessel having an outer wall and a plurality of electrodes, adjacent electrodes being spaced from one another to define a wall-receiving space therebetween. A replaceable first field shaping unit is provided, the first field shaping unit having a wall adapted to be received in the wall-receiving space between the electrodes and a first virtual electrode unit coupled to the wall. The first virtual electrode unit defines a first set of virtual electrodes having predefined relative positions. A second field shaping unit is provided, the second field shaping unit having a wall adapted to be received in the wall-receiving space between the electrodes and a second virtual electrode unit coupled to the wall. The second virtual electrode unit defines a second set of virtual electrodes having predefined relative positions. At least one functional characteristic of the first field shaping unit is identified and at least one functional characteristic of the second field shaping unit is identified. The identified functional characteristic of the first field shaping unit is different from the identified functional characteristic of the second field shaping unit, enabling a user to select between the first and second field shaping units to adapt the reaction vessel to treat a selected type of workpiece.

As noted above, other aspects of the invention provide electrochemical processing chambers. One such embodiment includes a reaction vessel, an electrode in an interior of the reaction vessel, and a first virtual electrode unit. The first virtual electrode unit defines a first virtual electrode in fluid communication with the electrode. The first virtual electrode unit is exchangeable for a second virtual electrode unit, without necessitating modification of the electrode, to adapt the processing chamber for treating a different workpiece. Such an adaptable processing chamber permits a manufacturer significant flexibility in producing a variety of products with minimal downtime.

An electrochemical processing chamber of another embodiment includes a reaction vessel having an inner surface and a first wall spaced from the inner surface of the reaction vessel. The first wall, which may be formed of a dielectric material, electrically separates a first electrode compartment, which receives a first electrode, from a second electrode compartment, which receives a second electrode. A first virtual electrode unit, which may comprise a dielectric material, defines a first virtual electrode in fluid communication with the first electrode compartment. The first virtual electrode unit also defines, in part, a second virtual electrode in fluid communication with the outer electrode compartment. The first virtual electrode unit is exchangeable for a second virtual electrode unit, without necessitating modification of the electrodes, to adapt the processing chamber for treating a different workpiece. Avoiding the need to modify the electrodes in this fashion allows a manufacturer to adapt this embodiment to be used with different workpieces quickly and without need for a separate inventory of different electrodes for each type of workpiece to be produced.

Yet another embodiment of the invention provides an electrochemical processing chamber including a reaction vessel and a replaceable field shaping unit. The reaction vessel includes a vessel wall and first and second electrodes, the first electrode being spaced radially inwardly of the second electrode. The field shaping unit includes a first wall, which electrically separates a first electrode compartment within which the first electrode is positioned, from a second electrode compartment within which the second electrode is positioned. The field shaping unit also includes a virtual electrode unit including a dielectric first partition coupled to the first wall. The first partition defines a first virtual electrode in fluid communication with the first electrode compartment and defines, in part, a second virtual electrode in fluid communication with the second electrode compartment. The replaceable field shaping unit is removable from the reaction vessel as a unit without necessitating modification of the reaction vessel. If so desired, the first field shaping unit of this embodiment may include a plurality of concentric walls electrically separating a plurality of concentric electrode compartments. The field shaping unit may also comprise a plurality of partitions and define a plurality of virtual electrodes, with a separate virtual electrode in fluid communication with each of the electrode compartments. The unit-based approach to modification afforded by this embodiment can ease transition from one type of workpiece to another.

An electrochemical processing system in accordance with one additional embodiment of the invention includes a reaction vessel, a replaceable first field shaping unit and a replaceable second field shaping unit. The reaction vessel includes an outer wall and a plurality of annular electrodes spaced from one another to define annular wall-receiving spaces therebetween. The first field shaping unit includes a plurality of concentric walls and a first virtual electrode unit. The walls may be positioned with respect to one another to be received in the wall-receiving spaces between the electrodes to define a plurality of concentric electrode compartments. The first virtual electrode unit may be coupled to the walls adjacent their upper edges and adapted to abut the outer wall of the reaction vessel adjacent the upper edge thereof. The first virtual electrode unit defines a first set of discharge openings having predefined relative positions, each of the discharge openings of the first set being adapted for fluid communication with one of the electrode compartments, with each discharge opening of the first set defining a position of an virtual electrode. The replaceable second field shaping unit is much like the first field shaping unit, but has a second set of discharge openings with relative positions differing from the relative positions of the discharge openings of the first set. The first field shaping unit and the second field shaping unit are each adapted for installation in and removal from the reaction vessel as a unit. Providing such a reaction vessel and different field shaping units allows a manufacturer to configure the electrochemical processing system to meet current production needs with a minimum of difficulty and wasted workpiece-dependent components.

Still another embodiment of the invention provides an electrochemical processing chamber including a reaction vessel having an interior; an electrode received in the interior of the reaction vessel; a first virtual electrode unit and a first contact assembly. The first virtual electrode unit, which may comprise a dielectric material, defines a first virtual electrode in fluid communication with the electrode. The first contact assembly is adapted to support a workpiece in a predetermined position with respect to the first virtual electrode. The first contact assembly is exchangeable for a second contact assembly and the first virtual electrode unit is exchangeable for a second virtual electrode unit, without necessitating modification of the electrode, to adapt the processing chamber for treating a differently-sized workpiece. Providing exchangeable contact assemblies and exchangeable virtual electrode units in accordance with this embodiment extends functionality of the processing chamber without requiring complex, time-consuming changes to switch from one size of workpiece to another.

DETAILED DESCRIPTION

The following description discloses the details and features of several embodiments of electrochemical reaction vessels for use in electrochemical processing stations and integrated tools to process microelectronic workpieces. The term "microelectronic workpiece" is used throughout to include a workpiece formed from a substrate upon which and/or in which microelectronic circuits or components, data storage elements or layers, and/or micro-mechanical elements are fabricated. It will be appreciated that several of the details set forth below are provided to describe the following embodiments in a manner sufficient to enable a person skilled in the art to make and use the disclosed embodiments. Several of the details and advantages described below, however, may not be necessary to practice certain embodiments of the invention. Additionally, the invention can also include additional embodiments that are within the scope of the claims, but are not described in detail with respect to FIGS. 2–13.

The operation and features of electrochemical reaction vessels are best understood in light of the environment and equipment in which they can be used to electrochemically process workpieces (e.g., electroplate and/or electropolish). As such, embodiments of integrated tools with processing stations having the electrochemical reaction vessels are initially described with reference to FIGS. 2 and 3. The details and features of several embodiments of electrochemical reaction vessels and methods for adapting the vessels to process different types of workpieces are then described with reference to FIGS. 4–13.

Figure 1:
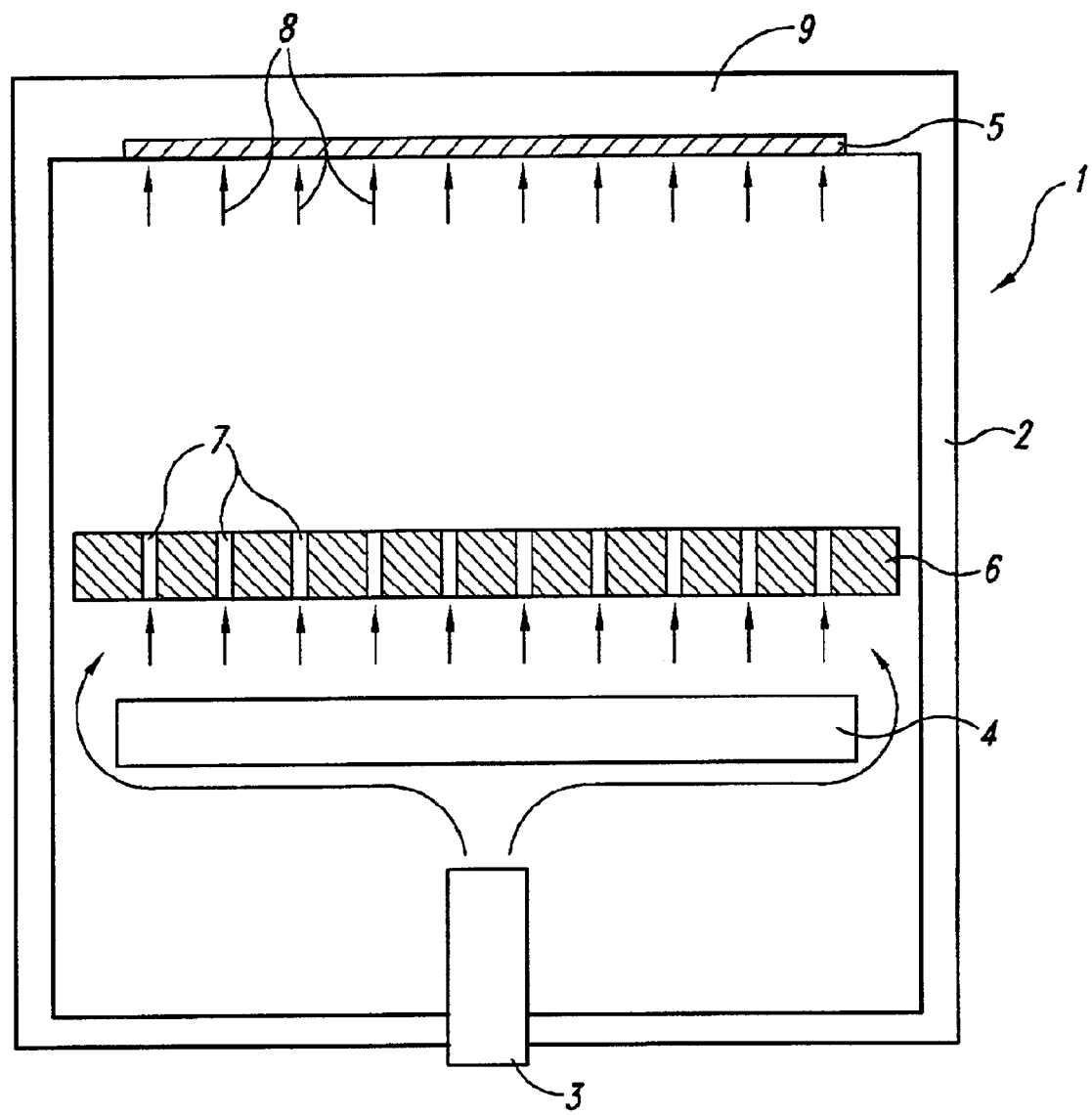
FIG. 1 is a schematic diagram of an electroplating chamber in accordance with the prior art.
Figure 2:
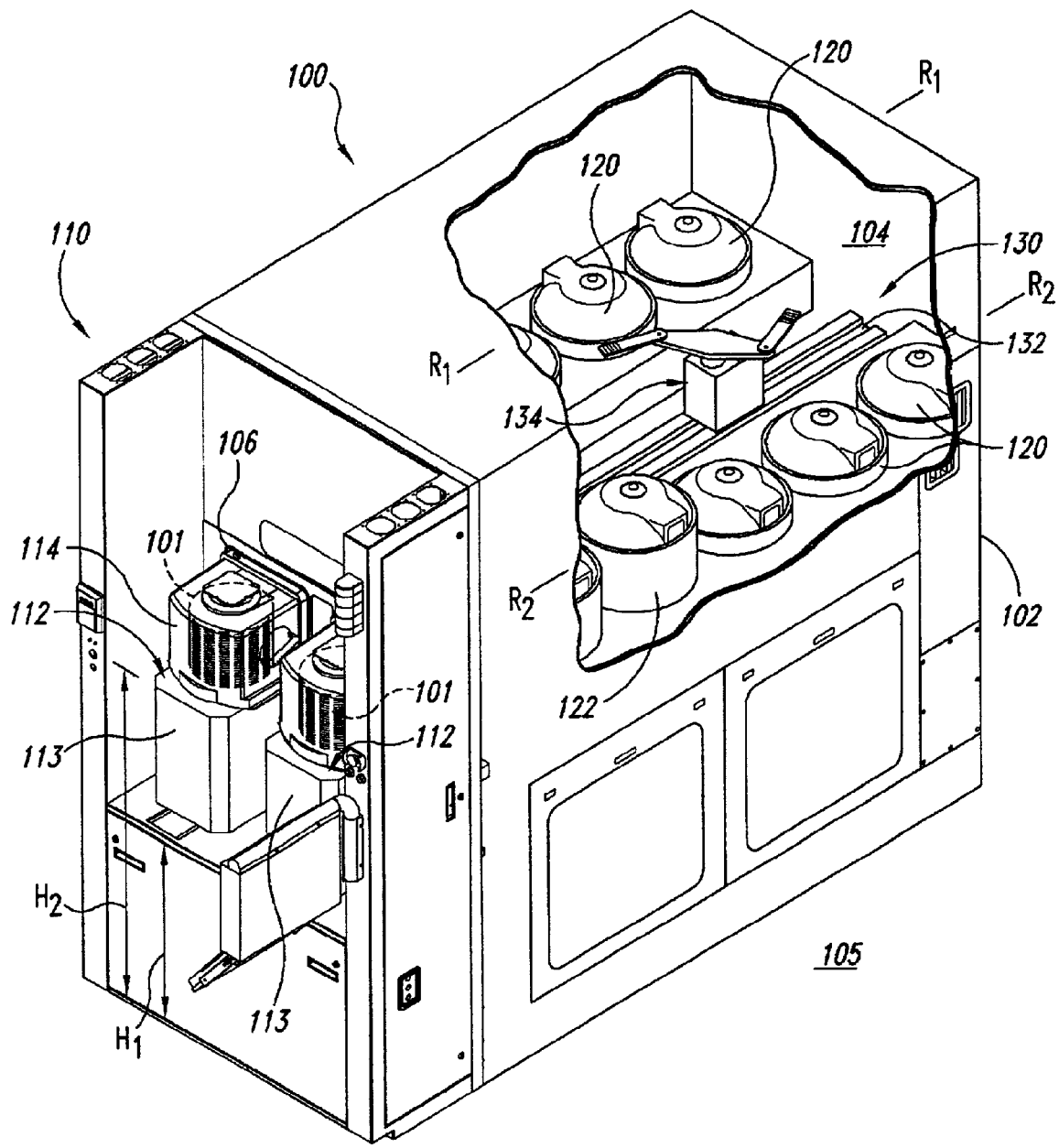
FIG. 2 is an isometric view of an electroprocessing machine having electroprocessing stations for processing microelectronic workpieces in accordance with an embodiment of the invention.

A. Selected Embodiments of Integrated Tools with Electrochemical Processing Stations FIG. 2 is an isometric view of a processing machine 100 having an electrochemical processing station 120 in accordance with an embodiment of the invention. A portion of the processing machine 100 is shown in a cut-away view to illustrate selected internal components. In one aspect of this embodiment, the processing machine 100 can include a cabinet 102 having an interior region 104 defining an interior enclosure that is at least partially isolated from an exterior region 105. The cabinet 102 can also include a plurality of apertures 106 (only one shown in FIG. 1) through which microelectronic workpieces 101 can ingress and egress between the interior region 104 and a load/unload station 110.

The load/unload station 110 can have two container supports 112 that are each housed in a protective shroud 113. The container supports 112 are configured to position workpiece containers 114 relative to the apertures 106 in the cabinet 102. The workpiece containers 114 can each house a plurality of microelectronic workpieces 101 in a "mini" clean environment for carrying a plurality of workpieces through other environments that are not at clean room standards. Each of the workpiece containers 114 is accessible from the interior region 104 of the cabinet 102 through the apertures 106.

The processing machine 100 can also include a plurality of electrochemical processing stations 120 and a transfer device 130 in the interior region 104 of the cabinet 102. The processing machine 100, for example, can be a plating tool that also includes clean/etch capsules 122, electroless plating stations, annealing stations, and/or metrology stations.

The transfer device 130 includes a linear track 132 extending in a lengthwise direction of the interior region 104 between the processing stations. The transfer device 130 can further include a robot unit 134 carried by the track 132. In the particular embodiment shown in FIG. 2, a first set of processing stations is arranged along a first row $R_1$—$R_1$ and a second set of processing stations is arranged along a second row $R_2$—$R_2$. The linear track 132 extends between the first and second rows of processing stations, and the robot unit 134 can access any of the processing stations along the track 132.

Figure 3:
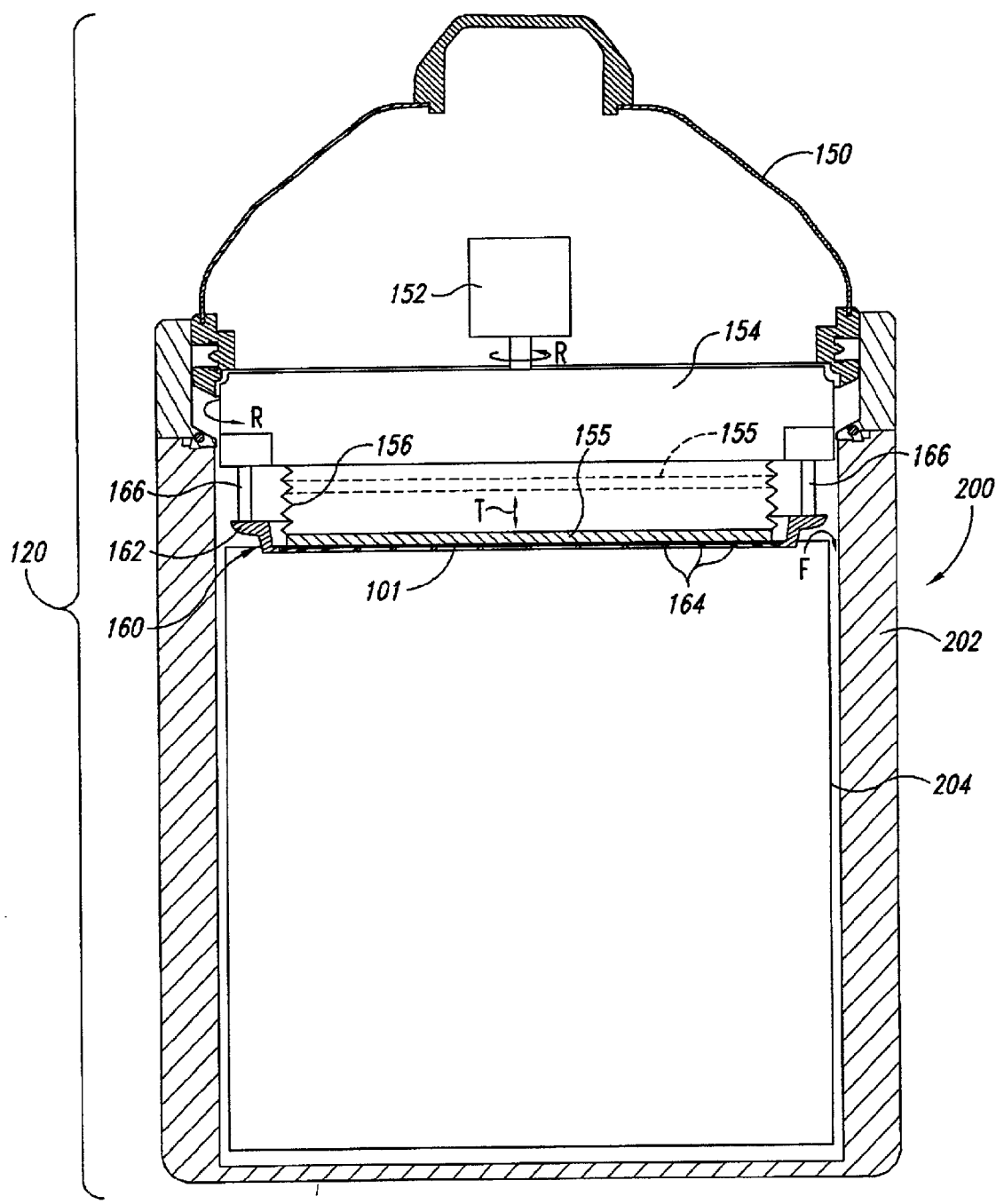
FIG. 3 is a cross-sectional view of an electroprocessing station having a processing chamber for use in an electroprocessing machine in accordance with an embodiment of the invention. Selected components in FIG. 3 are shown schematically.

FIG. 3 illustrates an embodiment of an electrochemical-processing chamber 120 having a head assembly 150 and a processing chamber 200. The head assembly 150 includes a spin motor 152, a rotor 154 coupled to the spin motor 152, and a contact assembly 160 carried by the rotor 154. The rotor 154 can have a backing plate 155 and a seal 156. The backing plate 155 can move transverse to a workpiece 101 (arrow T) between a first position in which the backing plate 155 contacts a backside of the workpiece 101 (shown in solid lines in FIG. 3) and a second position in which it is spaced apart from the backside of the workpiece 101 (shown in broken lines in FIG. 3). The contact assembly 160 can have a support member 162, a plurality of contacts 164 carried by the support member 162, and a plurality of shafts 166 extending between the support member 162 and the rotor 154. The contacts 164 can be ring-type spring contacts or other types of contacts that are configured to engage a portion of the seed-layer on the workpiece 101. Commercially available head assemblies 150 and contact assemblies 160 can be used in the electroprocessing chamber 120. Particular suitable head assemblies 150 and contact assemblies 160 are disclosed in U.S. Pat. Nos. 6,228,232 and 6,080,691; and U.S. application Ser. Nos. 09/385,784; 09/386,803; 09/386,610; 09/386,197; 09/501,002; 09/733,608; and 09/804,696, all of which are herein incorporated by reference.

The processing chamber 200 includes an outer housing 202 (shown schematically in FIG. 3) and a reaction vessel 204 (also shown schematically in FIG. 3) in the housing 202. The reaction vessel 204 carries at least one electrode (not shown in FIG. 3) and directs a flow of electroprocessing solution to the workpiece 101. The electroprocessing solution, for example, can flow over a weir (arrow F) and into the external housing 202, which captures the electroprocessing solution and sends it back to a tank. Several embodiments of reaction vessels 204 are shown and described in detail with reference to FIGS. 4–12.

In operation the head assembly 150 holds the workpiece at a workpiece-processing site of the reaction vessel 204 so that at least a plating surface of the workpiece engages the electroprocessing solution. An electrical field is established in the solution by applying an electrical potential between the plating surface of the workpiece via the contact assembly 160 and one or more electrodes in the reaction vessel 204. For example, the contact assembly 160 can be biased with a negative potential with respect to the electrode(s) in the reaction vessel 204 to plate materials onto the workpiece. On the other hand the contact assembly 160 can be biased with a positive potential with respect to the electrode(s) in the reaction vessel 204 to (a) de-plate or electropolish plated material from the workpiece or (b) deposit other materials (e.g., electrophoric resist). In general, therefore, materials can be deposited on or removed from the workpiece with the workpiece acting as a cathode or an anode depending upon the particular type of material used in the electrochemical process.

Figure 4:
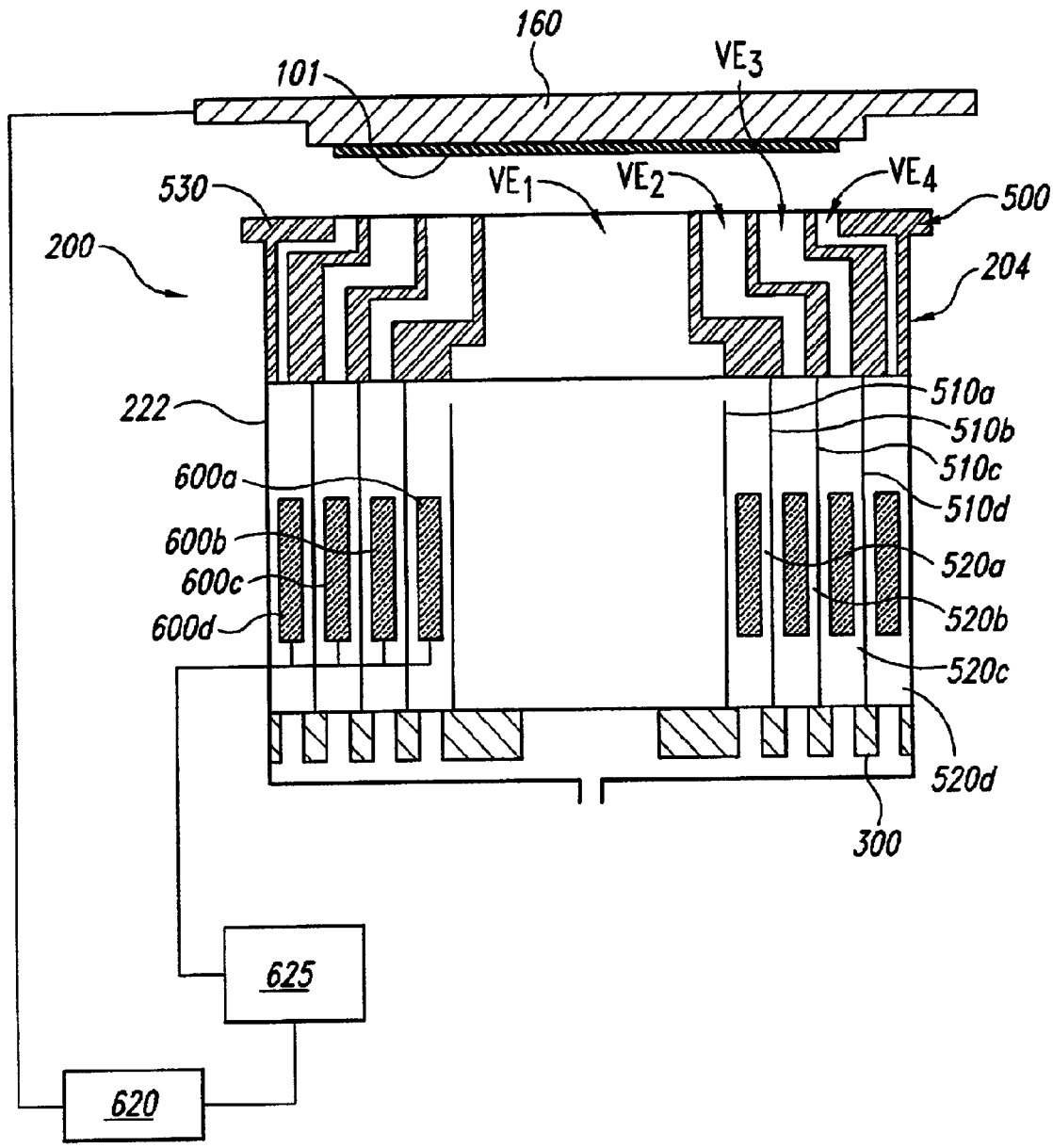
FIG. 4 is a schematic cross-sectional view of an electrochemical processing chamber in accordance with one embodiment of the invention.
Figure 5:
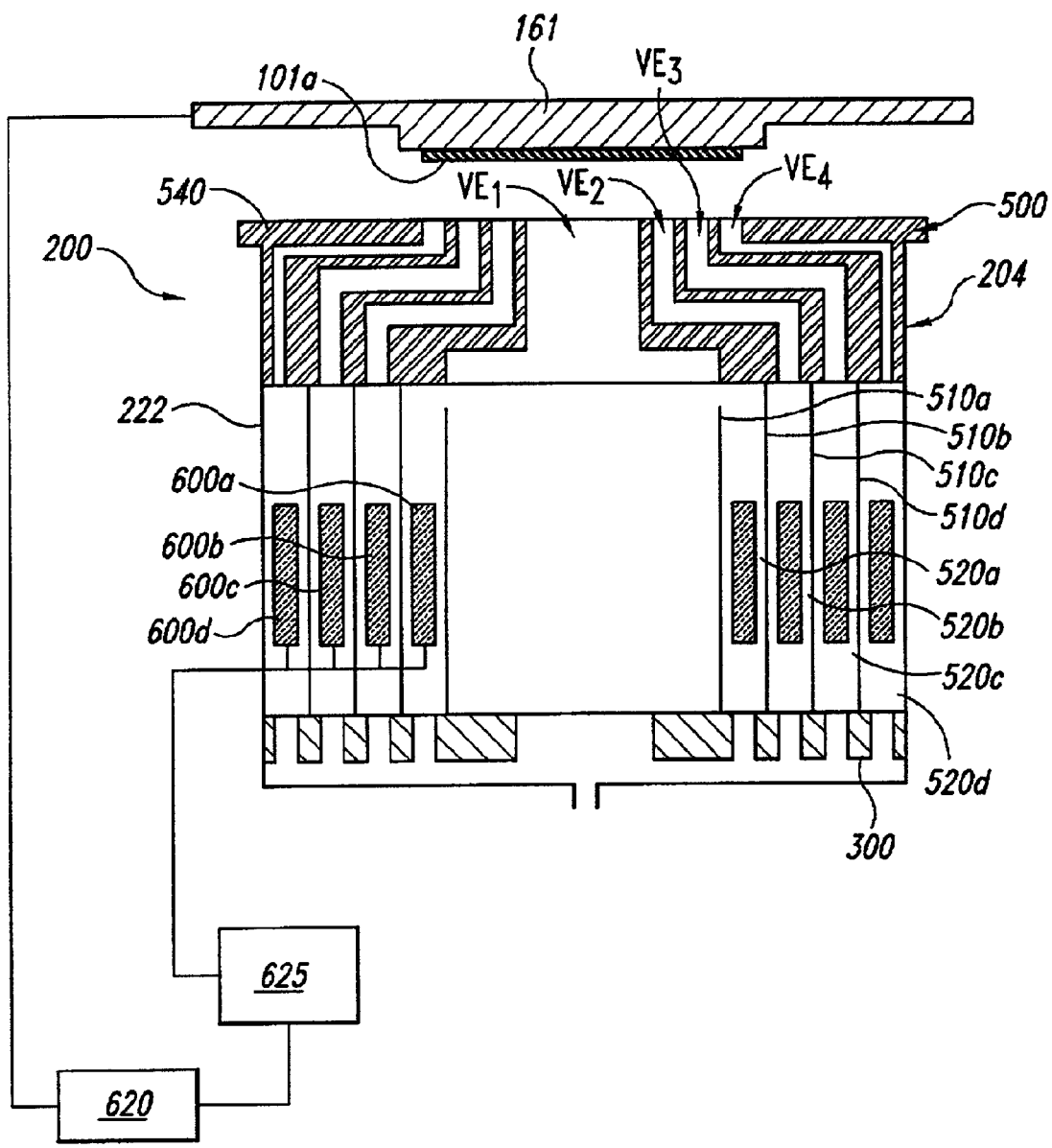
FIG. 5 is a schematic cross-sectional view of the electrochemical processing chamber of FIG. 4 modified to process a differently-sized workpiece.

B. Selected Embodiments of Reacting Vessels for Use in Electrochemical Processing Chambers FIGS. 4, 5 and 13 schematically illustrate aspects of processing chambers 200 in accordance with certain embodiments of the invention. Several embodiments of reaction vessels 204 for use in processing chambers 200 are shown in more detail in FIGS. 6–12.

The processing chamber 200 of FIG. 4 includes a reaction vessel 204 positioned beneath a contact assembly 160. The contact assembly 160 carries a workpiece 101 which may be brought into contact with the electroprocessing solution in the reaction vessel 204. For ease of explanation, FIG. 4 shows the contact assembly 160 and workpiece 101 spaced above the position they would occupy with respect to the reaction vessel in processing the workpiece.

The reaction vessel 204 of FIG. 4 has a plurality of annular electrodes 600a–d received therein. This particular embodiment employs four separate electrodes 600a–d, but it should be understood that any number of electrodes could be employed. While it is anticipated that there will be at least one electrode, there can be more than the four electrodes shown in FIG. 4. The electrodes may be connected to a common power supply 610, or each of the electrodes 600 may be provided with a separate power supply. FIG. 4 shows a power supply 610 electrically coupled to the contact assembly and to a power supply controller 625, which may independently control the power delivered to each of the electrodes 600a–d. In this fashion, a desired potential may be created between the workpiece 101 and each of the electrodes 600.

The electrodes 600 in FIG. 4 are housed in electrically separate electrode compartments 520. These electrode compartments 520 may be defined by a plurality of walls 510 received in the interior of the reaction vessel 204. In particular, a first electrode compartment 520a is defined by a first wall 510a and a second wall 510b, a second electrode compartment 520b is defined by the second wall 510b and a third wall 510c, a third electrode compartment 520c is defined by the third wall 510c and a fourth wall 510d, and a fourth electrode compartment 520d is defined by the fourth wall 510d and the outer wall 222 of the reaction vessel 204. The walls 510a–d of this embodiment are concentric annular dividers that define annular electrode compartments 520a–d.

The processing chamber 200 also includes a virtual electrode unit 530 which individually shapes the electrical fields produced by the electrodes 600a–d. This virtual electrode unit 530 may define one or more "virtual electrodes" that define the effective shape, size and position of the electrical field perceived by the workpiece. In one embodiment of the invention, the virtual electrode unit 530 defines a separate virtual electrode associated with each of the electrode compartments 520a–d. Hence, a first virtual electrode $VE_1$ is associated with the first electrode compartment 520a, a second virtual electrode $VE_2$ is associated with the second electrode compartment 520b, a third virtual electrode $VE_3$ is associated with the third electrode compartment 520c, and a fourth virtual electrode $VE_4$ is associated with the fourth electrode compartment 520d. Each of the virtual electrodes VE may be electrically connected to the electrode 600 received in the associated electrode compartment 520.

In one embodiment, the virtual electrodes VE are electrically associated with the electrode 600 in the associated electrode compartment 520 via flow of an electrically conductive processing fluid through the electrode compartment. As a result, each of the virtual electrodes VE receive an electrical potential with respect to the workpiece 101 from the associated electrode 600. Processing fluid may be delivered to the various electrode compartments via a distributor 300. For example, fluid from the distributor 300 will flow upwardly through the fourth electrode compartment 520d, passing over the fourth electrode 600d, then flow upwardly through the fourth virtual electrode $VE_4$ via a flow conduit in the virtual electrode unit 530. In this embodiment, therefore, the shape and size of each virtual electrode is defined by the shape and size of an opening in the virtual electrode unit 530 in fluid communication with one of the electrode compartments. Other embodiments of the invention may utilize virtual electrodes which need not be defined by the passage of fluid through an opening. As explained below in connection with FIG. 8, for example, ion-permeable membranes may limit the passage of bulk fluid from the electrode compartments 520b–d, instead merely passing ions through the membrane and to the associated virtual electrode.

In one embodiment, one or more of the walls 510a–d are coupled to the virtual electrode unit 530 to define a field shaping unit 500. Coupling the walls 510 to the virtual electrode unit 530 allows the field shaping unit to be removed from the reaction vessel as a unit. In one embodiment detailed below, the electrodes 600 remain in place in the reaction vessel 204 when the field shaping unit 500 is removed. If so desired, however, the electrodes 600 may be carried by the field shaping unit 500, such as by attaching electrodes 600 to the walls 510 or providing an electrically conductive coating on the walls 510 which can be electrically coupled to the power supply 620 or power supply controller 625 when the walls 510 are received in the reaction vessel 204 for processing a workpiece.

FIG. 5 illustrates the processing chamber 200 of FIG. 4, also in a schematic fashion. In FIG. 5, however, the processing chamber 200 has been modified to process a workpiece 101a which is smaller than the workpiece 101 shown in FIG. 4. Many features of the processing chamber 200 shown in FIG. 5 can be the same as those described in connection with FIG. 4, and thus like reference numbers refer to like parts in these Figures. The primary differences between the embodiment of FIG. 4 and the embodiment of FIG. 5 relate to the contact assembly and the virtual electrode assembly. In particular, the contact assembly 161 of FIG. 5 is adapted to hold a smaller workpiece than is the contact assembly 160 of FIG. 4 and the virtual electrode unit 540 in FIG. 5 defines a different arrangement of virtual electrodes VE than does the virtual electrode unit 530 of FIG. 4.

The virtual electrode unit 530 in FIG. 4 has virtual electrodes $VE_{1-4}$ which are sized and have relative positions adapted to process the larger first workpiece 101. The virtual electrodes $VE_{1-4}$ of the virtual electrode unit 540 in FIG. 5 may have different sizes and/or relative positions from the virtual electrodes $VE_{1-4}$ in the virtual electrode unit 530 in FIG. 4. In particular, the virtual electrodes VE of FIG. 4 may be optimized for processing the first workpiece 101 whereas the virtual electrodes VE of FIG. 5 may be optimized for processing the second workpiece 101a. As a consequence, the effective electrical field in the vicinity of the workpiece can be changed depending on the particular needs of different workpieces.

The processing chamber 200 may be modified from the configuration shown in FIG. 4 to the configuration shown in FIG. 5 by replacing the contact assembly 160 with a new contact assembly 161 and by replacing the virtual electrode unit 530 with a new virtual electrode unit 540. In some circumstances, it may not be necessary to replace the contact assembly, for example, when the two workpieces 101 and 101a are the same size, but have different processing requirements requiring different electrical fields. Hence, the processing chamber 200 can be quickly and easily modified from one configuration adapted to process a first workpiece 101 to a different configuration adapted to process a second workpiece 101a simply by replacing one virtual electrode unit 530 with a different virtual electrode unit 540. If the walls 510 are coupled to the virtual electrode unit 530 for removal of the field shaping unit 500 as a unit, the other virtual electrode unit 540 may also have walls 510 coupled thereto to define a different field shaping unit which can be placed in the reaction vessel 204 in the same position previously occupied by the previous field shaping unit 500. Similarly, if the electrodes 600 are carried by the walls 510 of the initial field shaping unit 500 shown in FIG. 4 for removal therewith as a unit, the replacement field shaping unit may also have electrodes 600 carried by its walls 510.

Hence, in accordance with several embodiments of the invention, a processing chamber 200 can be modified to process different workpieces in a simple, straightforward manner. In one embodiment explained below, this simplifies modifying an existing processing chamber 200 from a first configuration for treating a first workpiece to a second configuration for treating a different second workpiece. In another embodiment explained below, this enables a manufacturer greater flexibility in manufacturing processing lines customized to treat different workpieces.

Figure 6:
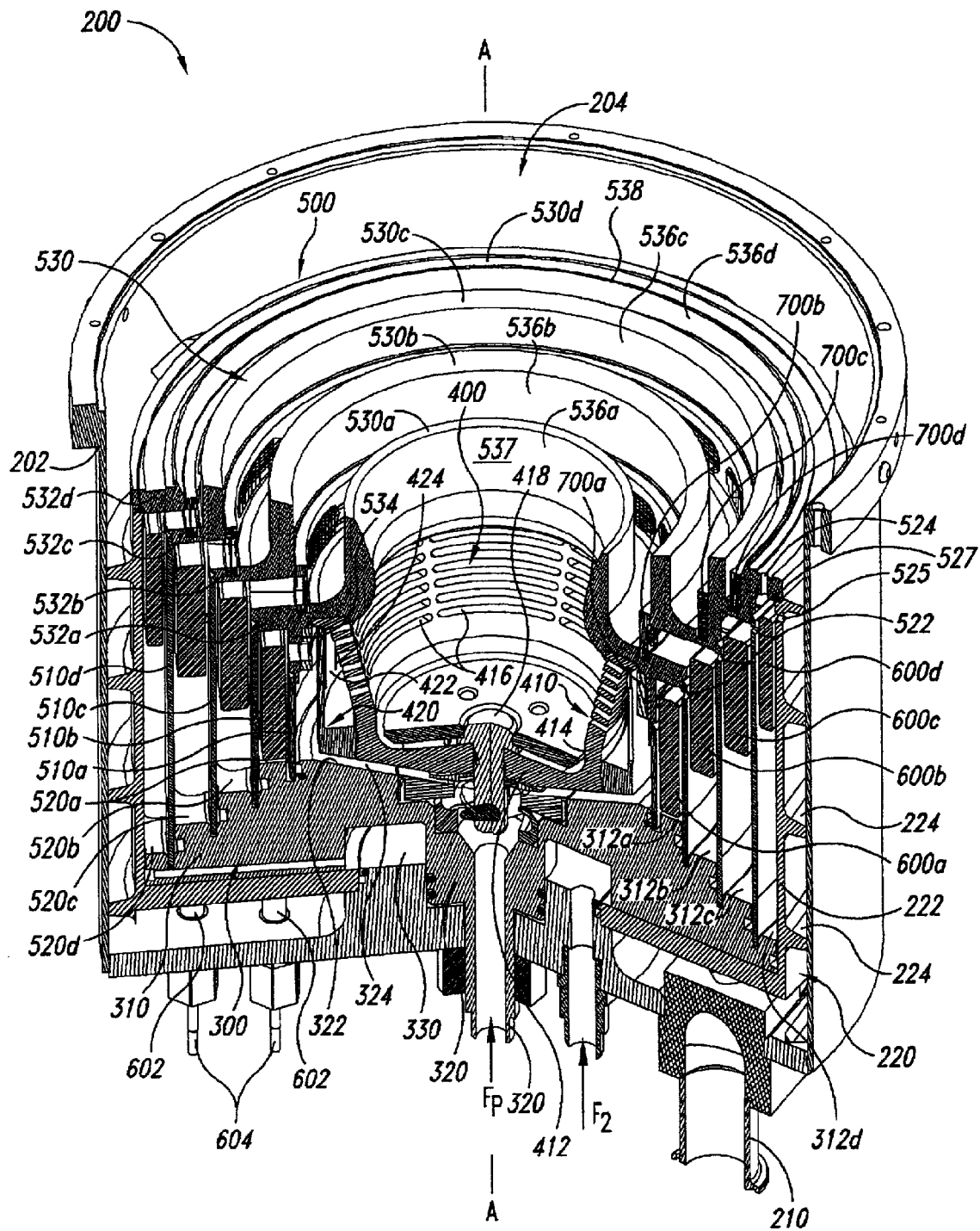
FIG. 6 is an isometric view showing a cross-sectional portion of a processing chamber taken along line 6—6 of FIG. 10A.

FIG. 6 more specifically illustrates an embodiment of a housing 202 receiving a reaction vessel 204 similar, in some respects, to the reaction vessel 204 shown schematically in FIG. 4. As many features of the reaction vessel 204 shown in FIG. 6 can be the same as those described with reference to FIGS. 4 and 5, like reference numbers refer to like parts in these Figures. The housing 202 in FIG. 6 can have a drain 210 for returning the processing fluid that flows out of the reaction vessel 204 to a storage tank, and a plurality of openings for receiving inlets and electrical fittings. The reaction vessel 204 can include an outer container 220 having an outer wall 222 spaced radially inwardly of the housing 202. The outer container 220 can also have a spiral spacer 224 between the outer wall 222 and the housing 202 to provide a spiral ramp (i.e., a helix) on which the processing fluid can flow downward to the bottom of the housing 202. The spiral ramp reduces the turbulence of the return fluid to inhibit entrainment of gasses in the return fluid.

FIGS. 4 and 5 illustrate reaction vessels 204 with distributors 300 receiving a flow of fluid from a single inlet. The particular embodiment of the reaction vessel 204 shown in FIG. 6, however, can include a distributor 300 for receiving a primary fluid flow $F_p$ and a secondary fluid flow $F_2$, a primary flow guide 400 coupled to the distributor 300 to condition the primary fluid flow $F_p$, and a field shaping unit 500 coupled to the distributor 300 to contain the secondary flow $F_2$ in a manner that shapes the electrical field in the reaction vessel 204. The reaction vessel 204 can also include at least one electrode 600 in a compartment of the field shaping unit 500 and at least one filter or other type of interface member 700 carried by the field shaping unit 500 downstream from the electrode. The primary flow guide 400 can condition the primary flow $F_p$ by projecting this flow radially inwardly relative to a common axis A—A, and a portion of the field shaping unit 500 directs the conditioned primary flow $F_p$ toward the workpiece. In several embodiments, the primary flow passing through the primary flow guide 400 and the center of the field shaping unit 500 controls the mass transfer of processing solution at the surface of the workpiece. The field shaping unit 500 also defines the shape the electric field, and it can influence the mass transfer at the surface of the workpiece if the secondary flow passes through the field shaping unit. The reaction vessel 204 can also have other configurations of components to guide the primary flow $F_p$ and the secondary flow $F_2$ through the processing chamber 200. The reaction vessel 204, for example, may not have a distributor in the processing chamber, but rather separate fluid lines with individual flows can be coupled to the vessel 204 to provide a desired distribution of fluid through the primary flow guide 400 and the field shaping unit. For example, the reaction vessel 204 can have a first outlet in the outer container 220 for introducing the primary flow into the reaction vessel and a second outlet in the outer container for introducing the secondary flow into the reaction vessel 204. Each of these components is explained in more detail below.

Figure 7A:
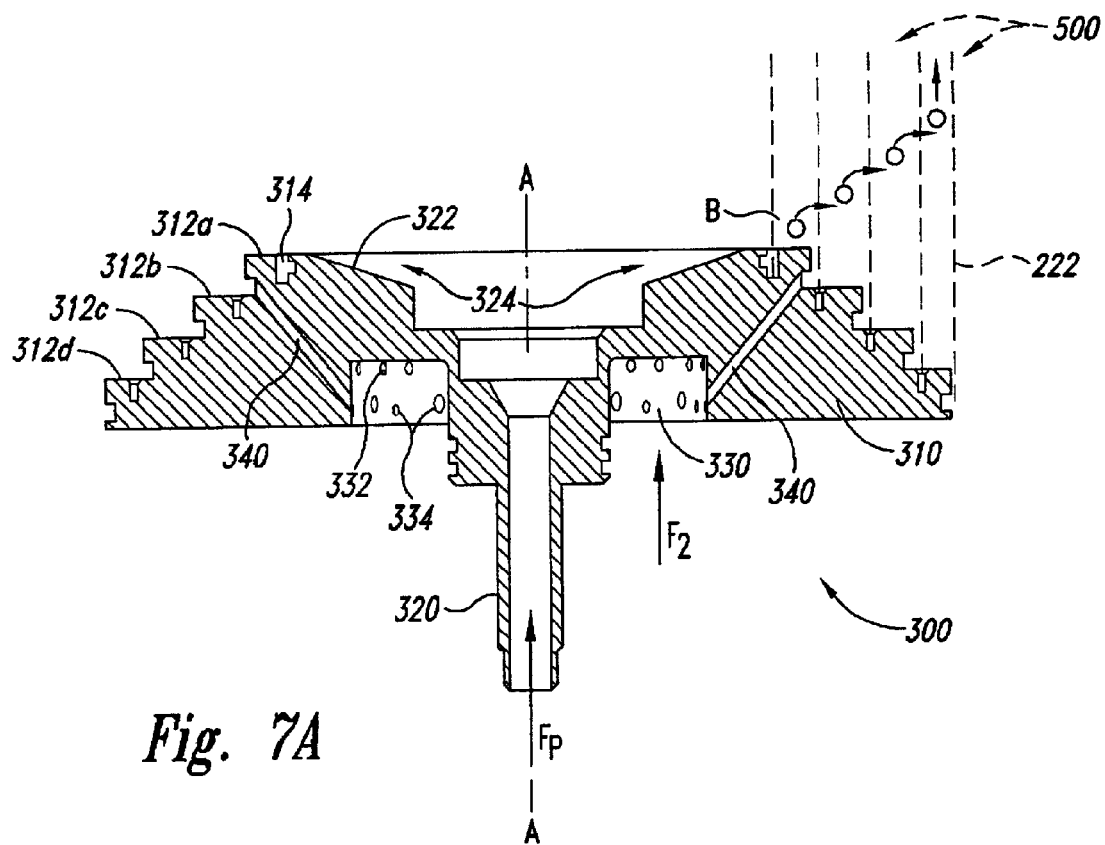
FIGS. 7A–7D are cross-sectional views of a distributor for a processing chamber in accordance with an embodiment of the invention.

FIGS. 7A–7D illustrate an embodiment of the distributor 300 for directing the primary fluid flow to the primary flow guide 400 and the secondary fluid flow to the field shaping unit 500. Referring to FIG. 7A, the distributor 300 can include a body 310 having a plurality of annular steps 312 (identified individually by reference numbers 312a–d) and annular grooves 314 in the steps 312. The outermost step 312d is radially inward of the outer wall 222 (shown in broken lines) of the outer container 220 (FIG. 6), and each of the interior steps 312a–c can carry an annular wall (shown in broken lines) of the field shaping unit 500 in a corresponding groove 314. The distributor 300 can also include a first inlet 320 for receiving the primary flow $F_p$ and a plenum 330 for receiving the secondary flow $F_2$. The first inlet 320 can have an inclined, annular cavity 322 to form a passageway 324 (best shown in FIG. 6) for directing the primary fluid flow $F_p$ under the primary flow guide 400. The distributor 300 can also have a plurality of upper orifices 332 along an upper part of the plenum 330 and a plurality of lower orifices 334 along a lower part of the plenum 330. As explained in more detail below, the upper and lower orifices are open to channels through the body 310 to distribute the secondary flow $F_2$ to the risers of the steps 312. The distributor 300 can also have other configurations, such as a "step-less" disk or non-circular shapes.

Figure 7B:
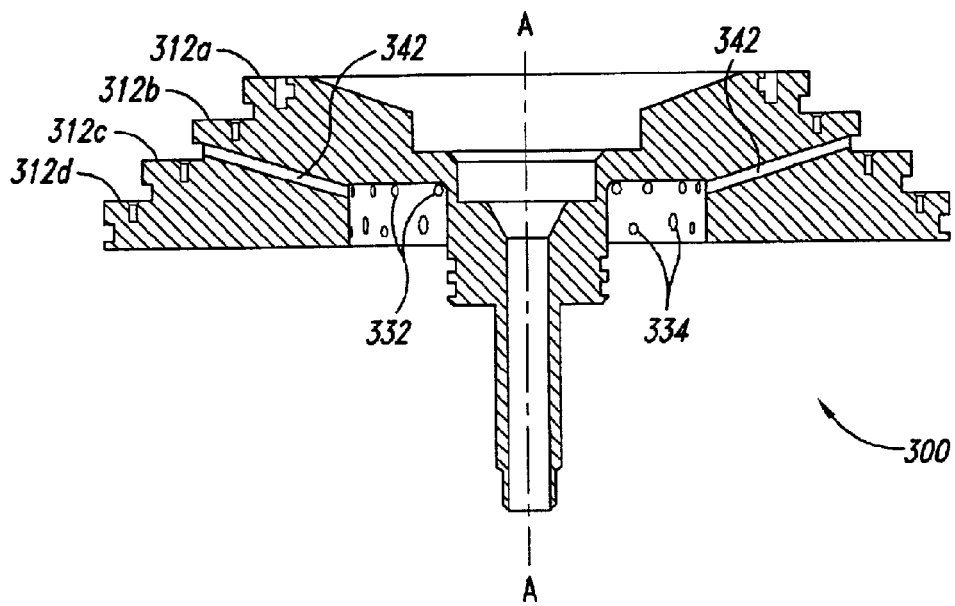
Figure 7C:
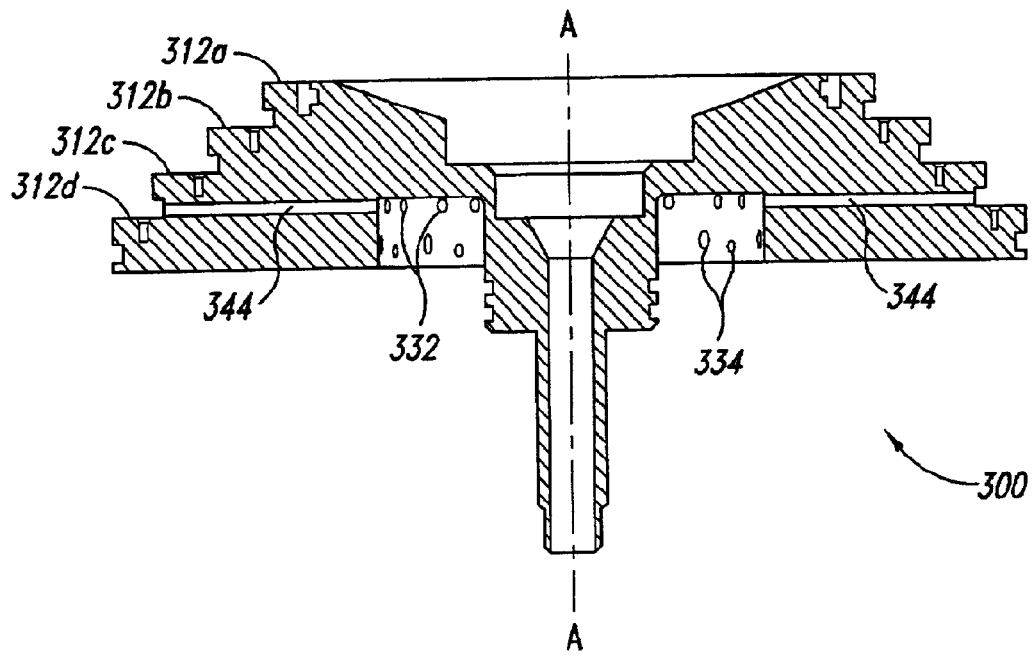
Figure 7D:
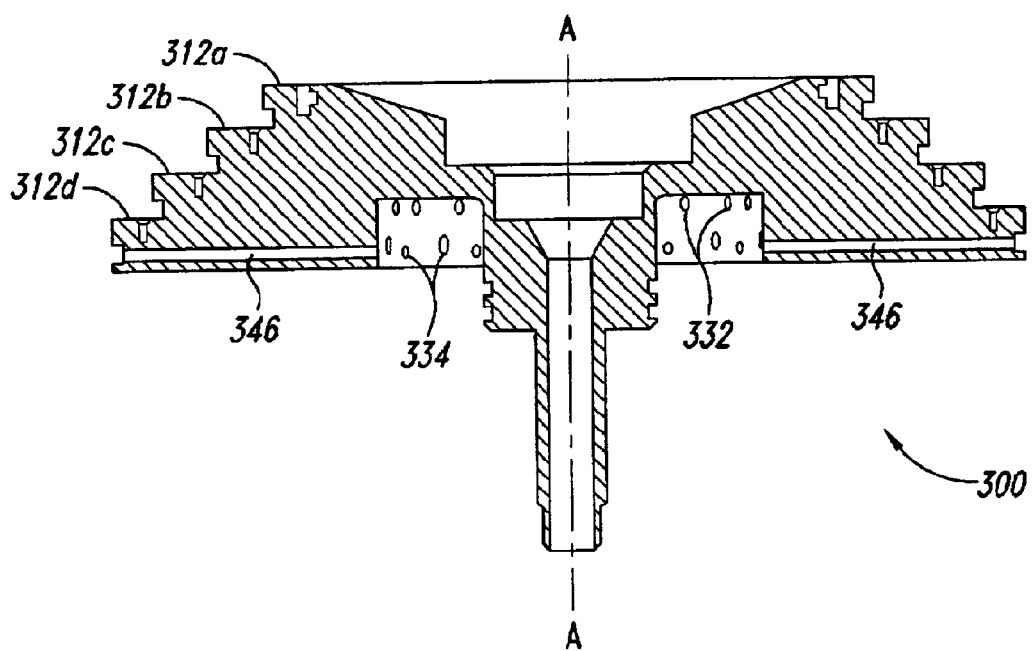

FIGS. 7A–7D further illustrate one configuration of channels through the body 310 of the distributor 300. Referring to FIG. 7A, a number of first channels 340 extend from some of the lower orifices 334 to openings at the riser of the first step 312a. FIG. 7B shows a number of second channels 342 extending from the upper orifices 332 to openings at the riser of the second step 312b, and FIG. 7C shows a number of third channels 344 extending from the upper orifices 332 to openings at the riser of the third step 312c. Similarly, FIG. 7D illustrates a number of fourth channels 346 extending from the lower orifices 334 to the riser of the fourth step 312d.

The particular embodiment of the channels 340–346 in FIGS. 7A–7D are configured to transport bubbles that collect in the plenum 330 radially outward as far as practical so that these bubbles can be captured and removed from the secondary flow $F_2$. This is beneficial because the field shaping unit 500 removes bubbles from the secondary flow $F_2$ by sequentially transporting the bubbles radially outwardly through electrode compartments. For example, a bubble B in the compartment above the first step 312a can sequentially cascade through the compartments over the second and third steps 312b–c, and then be removed from the compartment above the fourth step 312d. The first channel 340 (FIG. 7A) accordingly carries fluid from the lower orifices 334 where bubbles are less likely to collect to reduce the amount of gas that needs to cascade from the inner compartment above the first step 312a all the way out to the outer compartment. The bubbles in the secondary flow $F_2$ are more likely to collect at the top of the plenum 330 before passing through the channels 340–346. The upper orifices 332 are accordingly coupled to the second channel 342 and the third channel 344 to deliver these bubbles outward beyond the first step 312a so that they do not need to cascade through so many compartments. In this embodiment, the upper orifices 332 are not connected to the fourth channels 346 because this would create a channel that inclines downwardly from the common axis such that it may conflict with the groove 314 in the third step 312c. Thus, the fourth channel 346 extends from the lower orifices 334 to the fourth step 312d.

Referring again to FIG. 6, the primary flow guide 400 receives the primary fluid flow $F_p$ via the first inlet 320 of the distributor 300. In one embodiment, the primary flow guide 400 includes an inner baffle 410 and an outer baffle 420. The inner baffle can have a base 412 and a wall 414 projecting upward and radially outward from the base 412. The wall 414, for example, can have an inverted frusto-conical shape and a plurality of apertures 416. The apertures 416 can be holes, elongated slots or other types of openings. In the illustrated embodiment, the apertures 416 are annularly extending radial slots that slant upward relative to the common axis to project the primary flow radially inward and upward relative to the common axis along a plurality of diametrically opposed vectors. The inner baffle 410 can also include a locking member 418 that couples the inner baffle 410 to the distributor 300.

The outer baffle 420 can include an outer wall 422 with a plurality of apertures 424. In this embodiment, the apertures 424 are elongated slots extending in a direction transverse to the apertures 416 of the inner baffle 410. The primary flow $F_p$ flows through (a) the first inlet 320, (b) the passageway 324 under the base 412 of the inner baffle 410, (c) the apertures 424 of the outer baffle 420, and then (d) the apertures 416 of the inner baffle 410. The combination of the outer baffle 420 and the inner baffle 410 conditions the direction of the flow at the exit of the apertures 416 in the inner baffle 410. The primary flow guide 400 can thus project the primary flow along diametrically opposed vectors that are inclined upward relative to the common axis to create a fluid flow that has a highly uniform velocity. In alternate embodiments, the apertures 416 do not slant upward relative to the common axis such that they can project the primary flow normal, or even downward, relative to the common axis.

FIG. 6 also illustrates an embodiment of the field shaping unit 500 that receives the primary fluid flow $F_p$ downstream from the primary flow guide 400. The field shaping unit 500 also contains the second fluid flow $F_2$ and shapes the electrical field within the reaction vessel 204. In this embodiment, the field shaping unit 500 has a compartment structure with a plurality of walls 510 (identified individually by reference numbers 510a–d) that define a plurality of electrode compartments 520 (identified individually by reference numbers 520a–d). The walls 510 can be annular skirts or dividers, and they can be received in one of the annular grooves 314 in the distributor 300. In one embodiment, the walls 510 are not fixed to the distributor 300 so that the field shaping unit 500 can be quickly removed from the distributor 300. For example, each of the walls 510 may have a lower edge which is releasably received in the annular grooves 314 in the distributor 300. This allows easy access to the electrode compartments 520 and/or quick removal of the field shaping unit 500 as a unit to change the shape of the electric field, as explained in more detail below.

The field shaping unit 500 can have at least one wall 510 outward from the primary flow guide 400 to prevent the primary flow $F_p$ from contacting an electrode. In the particular embodiment shown in FIGS. 6 and 8, the field shaping unit 500 has a first electrode compartment 520a between the first and second walls 510a–b, a second electrode compartment 520b between the second and third walls 510b–c, a third electrode compartment 520c between the third and fourth walls 510c–d, and a fourth electrode compartment 520d between the fourth wall 510d and the outer wall 222 of the container 220. Although the walls 510a–d of FIG. 6 define annular electrode compartments 520a–d, alternate embodiments of the field shaping unit can have walls with different configurations to create non-annular electrode compartments and/or each electrode compartment can be further divided into cells. The second-fourth walls 510b–d can also include holes 522 for allowing bubbles in the first-third electrode compartments 520a–c to "cascade" radially outward to the next outward electrode compartment 520 as explained above with respect to FIGS. 7A–7D. The bubbles can then exit the fourth electrode compartment 520d through an exit hole 525 through the outer wall 222. In an alternate embodiment, the bubbles can exit through an exit hole 524.

The electrode compartments 520 provide electrically discrete compartments to house an electrode assembly having at least one electrode and generally two or more electrodes 600 (identified individually by reference numbers 600a–d). The electrodes 600 can be annular members (e.g., annular rings or arcuate sections) that are configured to fit within annular electrode compartments, or they can have other shapes appropriate for the particular workpiece (e.g., rectilinear). In the illustrated embodiment, for example, the electrode assembly includes a first annular electrode 600a in the first electrode compartment 520a, a second annular electrode 600b in the second electrode compartment 520b, a third annular electrode 600c in the third electrode compartment 520c, and a fourth annular electrode 600d in the fourth electrode compartment 520d. The electrodes 600 may be supported in the reaction vessel 204 in any suitable fashion. In the particular embodiment shown in FIG. 6, the electrodes are supported by pillars 602 which extend upwardly from a bottom of the reaction vessel 204. These pillars 602 may be hollow, serving as a guide for wires 604 connecting the electrodes 600 to power supplies. As explained in U.S. application Ser. Nos. 60/206,661, 09/845,505, and 09/804,697, all of which are incorporated herein by reference, each of the electrodes 600a–d can be biased with the same or different potentials with respect to the workpiece to control the current density across the surface of the workpiece. In alternate embodiments, the electrodes 600 can be non-circular shapes or sections of other shapes.

Embodiments of the reaction vessel 204 that include a plurality of electrodes provide several benefits for plating or electropolishing. In plating applications, for example, the electrodes 600 can be biased with respect to the workpiece at different potentials to provide uniform plating on different workpieces even though the seed layers vary from one another or the bath(s) of electroprocessing solution have different conductivities and/or concentrations of constituents. Additionally, another the benefit of having a multiple electrode design is that plating can be controlled to achieve different final fill thicknesses of plated layers or different plating rates during a plating cycle or in different plating cycles. Other benefits of particular embodiments are that the current density can be controlled to (a) provide a uniform current density during feature filling and/or (b) achieve plating to specific film profiles across a workpiece (e.g., concave, convex, flat). Accordingly, the multiple electrode configurations in which the electrodes are separate from one another provide several benefits for controlling the electrochemical process to (a) compensate for deficiencies or differences in seed layers between workpieces, (b) adjust for variances in baths of electroprocessing solutions, and/or (c) achieve predetermined feature filling or film profiles.

In the illustrated embodiment, the adjacent electrodes 600 are spaced from one another to define annular spaces for receiving a wall 510. Hence, the second wall 510b is received in the annular space between the first electrode 600a and the second electrode 600b, the third wall 510c is received in the annular space between the second electrode 600b and the third electrode 600c, and the fourth wall 510d is received in the annular space between the third electrode 600c and the fourth electrode 600d. In one embodiment, the annular spaces between the electrodes 600 are sufficiently large to allow the walls to slide therein for removal and installation of the walls 510 in the reaction vessel 204 without modifying the electrodes 600. If so desired, spacers (not shown) may be positioned between the walls 510 and the adjacent electrodes 600 to help center the electrodes 600 within their respective electrode compartments 520.

The field shaping unit 500 can also include a virtual electrode unit 530 coupled to the walls 510 of the compartment assembly for individually shaping the electrical fields produced by the electrodes 600. In this particular embodiment, the virtual electrode unit includes first-fourth partitions 530a–530d, respectively. The first partition 530a can have a first section 532a coupled to the second wall 510b, a skirt 534 depending downward above the first wall 510a, and a lip 536a projecting upwardly. The lip 536a has an interior surface 537 that directs the primary flow $F_p$ exiting from the primary flow guide 400. The second partition 530b can have a first section 532b coupled to the third wall 510c and a lip 536b projecting upward from the first section 532b, the third partition 530c can have a first section 532c coupled to the fourth wall 510d and a lip 536c projecting upward from the first section 532c, and the fourth partition 530d can have a first section 532d carried by the outer wall 222 of the container 220 and a lip 536d projecting upward from the first section 532d. The fourth partition 530d may simply abut the outer wall 222 so that the field shaping unit 500 can be quickly removed from the vessel 204 by simply lifting the virtual electrode unit. The interface between the fourth partition 530d and the outer wall 222 is sealed by a seal 527 to inhibit both the fluid and the electrical current from leaking out of the fourth electrode compartment 520d. The seal 527 can be a lip seal. Additionally, each of the sections 532a–d can be lateral sections extending transverse to the common axis.

In one embodiment, each of the individual partition elements 530a–d are joined together so the virtual electrode unit 530 can be removed from the reaction vessel as a unit rather than separately as discrete elements. For example, the individual partitions 530a–d can be machined from or molded into a single piece of dielectric material, or they can be individual dielectric members welded or otherwise joined together. In alternate embodiments, the individual partitions 530a–d are not attached to each other and/or they can have different configurations. In the particular embodiment shown in FIG. 6, the first sections 532a–d of the partitions 530a–d are annular horizontal members and each of the lips 536a–d are annular vertical members arranged concentrically.

The walls 510a–d and the virtual electrode unit 530 are generally dielectric materials that contain the second flow $F_2$ of the processing solution for shaping the electric fields generated by the electrodes 600a–d. The second flow $F_2$, for example, can pass (a) through each of the electrode compartments 520a–d, (b) between the individual partitions 530a–d, and then (c) upward through the annular openings between the lips 536a–d. In this embodiment, the secondary flow $F_2$ through the first electrode compartment 520a can join the primary flow $F_p$ in an antechamber just before the primary flow guide 400, and the secondary flow through the second-fourth electrode compartments 520b–d can join the primary flow $F_p$ beyond the top edges of the lips 536a–d. The flow of electroprocessing solution then flows over a shield weir attached at rim 538 and into the gap between the housing 202 and the outer wall 222 of the container 220 as disclosed in International Application No. PCT/US00/10120. As explained below with reference to FIG. 6, the fluid in the secondary flow $F_2$ can be prevented from flowing out of the electrode compartments 520a–d to join the primary flow $F_p$ while still allowing electrical current to pass from the electrodes 600 to the primary flow. In this alternate embodiment, the secondary flow $F_2$ can exit the reaction vessel 204 through the holes 522 in the walls 510 and the hole 525 in the outer wall 222. In still additional embodiments in which the fluid of the secondary flow does not join the primary flow, a duct can be coupled to the exit hole 525 in the outer wall 222 so that a return flow of the secondary flow passing out of the field shaping unit 500 does not mix with the return flow of the primary flow passing down the spiral ramp outside of the outer wall 222.

The field shaping unit 500 can have other configurations that are different than the embodiment shown in FIG. 6. For example, the electrode compartment assembly can have only a single wall 510 defining a single electrode compartment 520, and the reaction vessel 204 can include only a single electrode 600. The field shaping unit of either embodiment still separates the primary and secondary flows so that the primary flow does not engage the electrode, and thus it shields the workpiece from the single electrode. One advantage of shielding the workpiece from the electrodes 600a–d is that the electrodes can accordingly be much larger than they could be without the field shaping unit because the size of the electrodes does not have-effect on the electrical field presented to the workpiece. This is particularly useful in situations that use consumable electrodes because increasing the size of the electrodes prolongs the life of each electrode, which reduces downtime for servicing and replacing electrodes.

An embodiment of reaction vessel 204 shown in FIG. 6 can accordingly have a first conduit system for conditioning and directing the primary fluid flow $F_p$ to the workpiece, and a second conduit system for conditioning and directing the secondary fluid flow $F_2$. The first conduit system, for example, can include the inlet 320 of the distributor 300; the channel 324 between the base 412 of the primary flow guide 400 and the inclined cavity 322 of the distributor 300; a plenum between the wall 422 of the outer baffle 420 and the first wall 510a of the field shaping unit 500; the primary flow guide 400; and the interior surface 537 of the first lip 536a. The first conduit system conditions the direction of the primary fluid flow $F_p$ by passing it through the primary flow guide 400 and along the interior surface 537 so that the velocity of the primary flow $F_p$ normal to the workpiece is at least substantially uniform across the surface of the workpiece. The primary flow $F_p$ and rotation of the workpiece can accordingly be controlled to dominate the mass transfer of electroprocessing medium at the workpiece.

The second conduit system, for example, can include the plenum 330 and the channels 340–346 of the distributor 300, the walls 510 of the field shaping unit 500, and the partitions 530a–d of the field shaping unit 500. The secondary flow $F_2$ contacts the electrodes 600 to establish individual electrical fields in the field shaping unit 500 that are electrically coupled to the primary flow $F_p$. The field shaping unit 500, for example, separates the individual electrical fields created by the electrodes 600a–d to create "virtual electrodes" at the top of the openings defined by the lips 536a–d of the partitions. In this particular embodiment, the central opening inside the first lip 536a defines a first virtual electrode, the annular opening between the first and second lips 536a–b defines a second virtual electrode, the annular opening between the second and third lips 536b–c defines a third virtual electrode, and the annular opening between the third and fourth lips 536c–d defines a fourth virtual electrode. These are "virtual electrodes" because the field shaping unit 500 shapes the individual electrical fields of the actual electrodes 600a–d so that the effect of the electrodes 600a–d acts as if they are placed between the top edges of the lips 536a–d. This allows the actual electrodes 600a–d to be isolated from the primary fluid flow, which can provide several benefits as explained in more detail below.

An additional embodiment of the processing chamber 200 includes at least one interface member 700 (identified individually by reference numbers 700a–d) for further conditioning the secondary flow $F_2$ of electroprocessing solution. The interface members 700, for example, can be filters that capture particles in the secondary flow that were generated by the electrodes (i.e., anodes) or other sources of particles. The filter-type interface members 700 can also inhibit bubbles in the secondary flow $F_2$ from passing into the primary flow $F_p$ of electroprocessing solution. This effectively forces the bubbles to pass radially outwardly through the holes 522 in the walls 510 of the field shaping unit 500. In alternate embodiments, the interface members 700 can be ion-membranes that allow ions in the secondary flow $F_2$ to pass through the interface members 700. The ion-membrane interface members 700 can be selected to (a) allow the fluid of the electroprocessing solution and ions to pass through the interface member 700, or (b) allow only the desired ions to pass through the interface member such that the fluid itself is prevented from passing beyond the ion-membrane.

Figure 8:
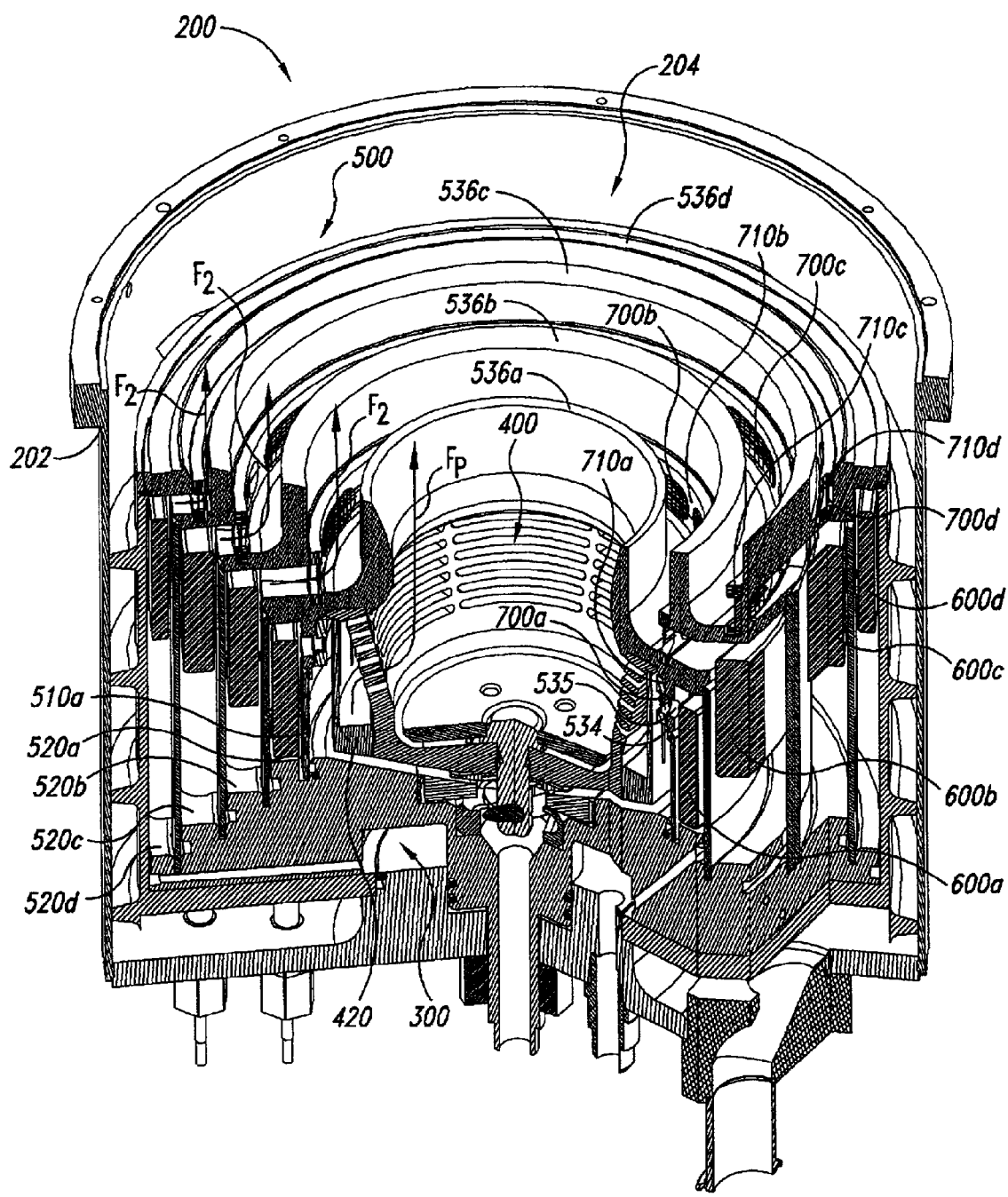
FIG. 8 is an isometric view showing a different cross-sectional portion of the processing chamber of FIG. 6 taken along line 8—8 of FIG. 10B.
Figure 10A:
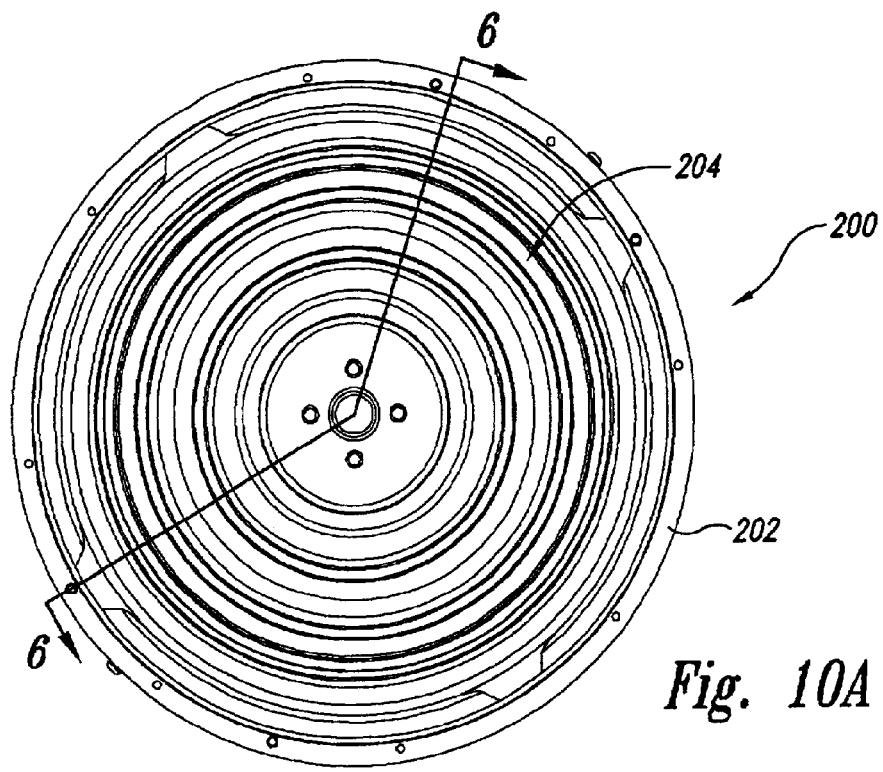
FIGS. 10A and 10B are top plan views of a processing chamber that provide a reference for the isometric, cross-sectional views of FIGS. 6 and 8, respectively.
Figure 10B:
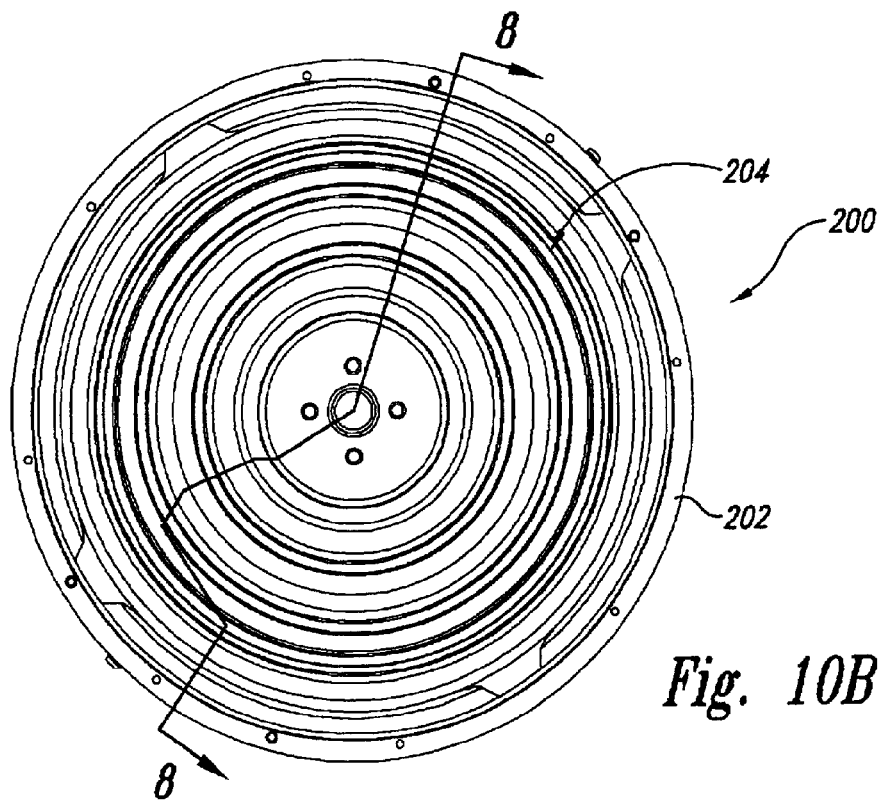

FIG. 8 is another isometric view of the reaction vessel 204 of FIG. 6 showing a cross-sectional portion taken along a different cross-section. More specifically, the cross-section of FIG. 6 is shown in FIG. 10A and the cross-section of FIG. 8 is shown in FIG. 10B. Returning now to FIG. 8, this illustration further shows one embodiment for configuring a plurality of interface members 700a–d relative to the partitions 530a–d of the field shaping unit 500. A first interface member 700a can be attached to the skirt 534 of the first partition 530a so that a first portion of the secondary flow $F_2$ flows past the first electrode 600a, through an opening 535 in the skirt 534, and then to the first interface member 700a. Another portion of the secondary flow $F_2$ can flow past the second electrode 600b to the second interface member 700b. Similarly, portions of the secondary flow $F_2$ can flow past the third and fourth electrodes 600c–d to the third and fourth interface members 700c–d.

When the interface members 700a–d are filters or ion-membranes that allow the fluid in the secondary flow $F_2$ to pass through the interface members 700a–d, the secondary flow $F_2$ joins the primary fluid flow $F_p$. The portion of the secondary flow $F_2$ in the first electrode compartment 520a can pass through the opening 535 in the skirt 534 and the first interface member 700a, and then into a plenum between the first wall 510a and the outer wall 422 of the baffle 420. This portion of the secondary flow $F_2$ accordingly joins the primary flow $F_p$ and passes through the primary flow guide 400. The other portions of the secondary flow $F_2$ in this particular embodiment pass through the second-fourth electrode compartments 520b–d and then through the annular openings between the lips 536a–d. The second-fourth interface members 700b–d can accordingly be attached to the field shaping unit 500 downstream from the second-fourth electrodes 600b–d.

In the particular embodiment shown in FIG. 8, the second interface member 700b is positioned vertically between the first and second partitions 530a–b, the third interface member 700c is positioned vertically between the second and third partitions 530b–c, and the fourth interface member 700d is positioned vertically between the third and fourth partitions 530c–d. The interface assemblies 710a–d are generally installed vertically, or at least at an upwardly inclined angle relative to horizontal, to force the bubbles to rise so that they can escape through the holes 522 in the walls 510a–d (FIG. 6). This prevents aggregations of bubbles that could potentially disrupt the electrical field from an individual electrode.

Figure 9A:
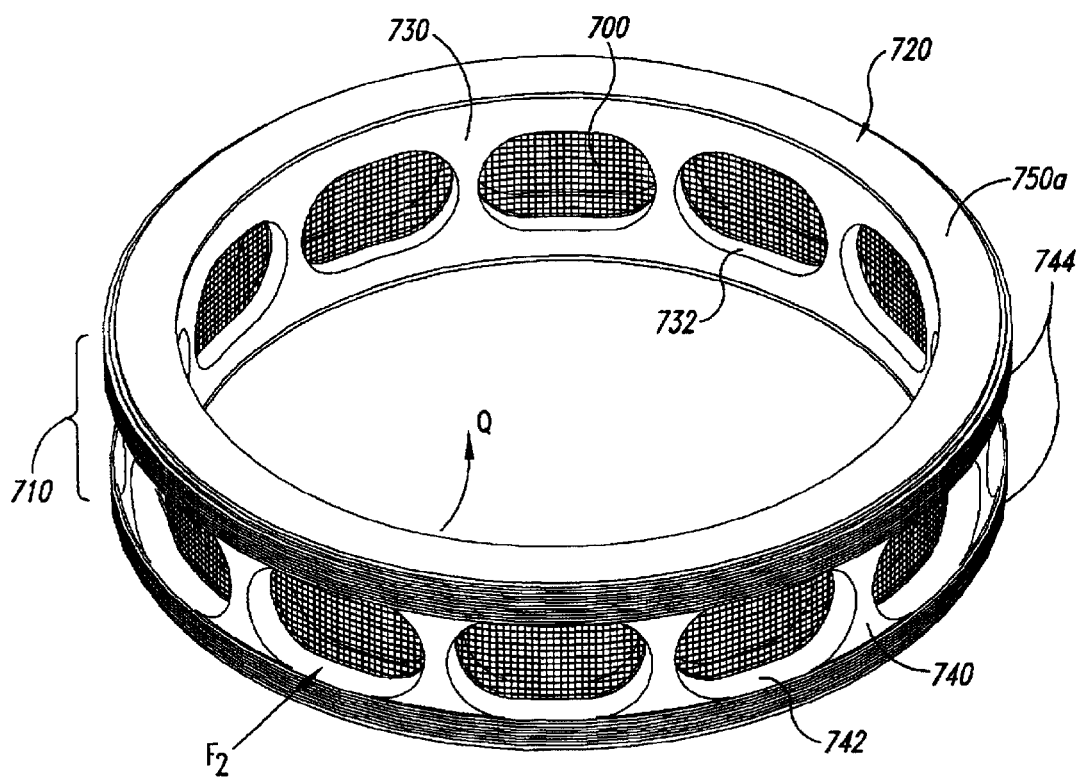
FIG. 9A is an isometric view of an interface assembly for use in a processing chamber in accordance with an embodiment of the invention.
Figure 9B:
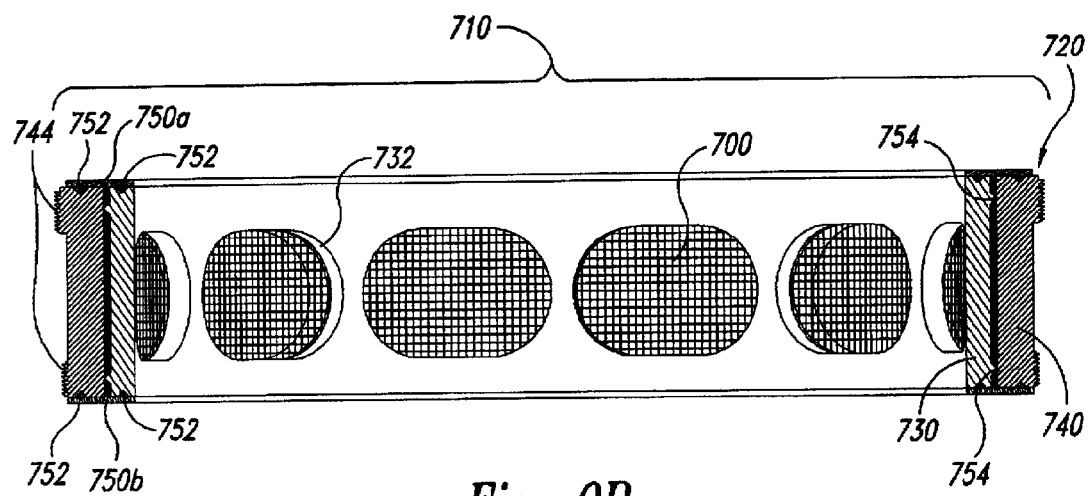
FIG. 9B is a cross-sectional view of the interface assembly of FIG. 9A.

FIGS. 9A and 9B illustrate an interface assembly 710 for mounting the interface members 700 to the field shaping unit 500 in accordance with an embodiment of the invention. The interface assembly 710 can include an annular interface member 700 and a fixture 720 for holding the interface member 700. The fixture 720 can include a first frame 730 having a plurality of openings 732 and a second frame 740 having a plurality of openings 742 (best shown in FIG. 9A). The holes 732 in the first frame can be aligned with the holes 742 in the second frame 740. The second frame can further include a plurality of annular teeth 744 extending around the perimeter of the second frame. It will be appreciated that the teeth 744 can alternatively extend in a different direction on the exterior surface of the second frame 740 in other embodiments, but the teeth 744 generally extend around the perimeter of the second frame 740 in a top annular band and a lower annular band to provide annular seals with the partitions 536a–d (FIG. 6). The interface member 700 can be pressed between the first frame 730 and the second frame 740 to securely hold the interface member 700 in place. The interface assembly 710 can also include a top band 750a extending around the top of the frames 730 and 740 and a bottom band 750b extending around the bottom of the frames 730 and 740. The top and bottom bands 750a–b can be welded to the frames 730 and 740 by annular welds 752. Additionally, the first and second frames 730 and 740 can be welded to each other by welds 754. It will be appreciated that the interface assembly 710 can have several different embodiments that are defined by the configuration of the field shaping unit 500 (FIG. 6) and the particular configuration of the electrode compartments 520a–d (FIG. 6).

When the interface member 700 is a filter material that allows the secondary flow $F_2$ of electroprocessing solution to pass through the holes 732 in the first frame 730, the post-filtered portion of the solution continues along a path (arrow Q) to join the primary fluid flow $F_p$ as described above. One suitable material for a filter-type interface member 700 is POREX®, which is a porous plastic that filters particles to prevent them from passing through the interface member. In plating systems that use consumable anodes (e.g., phosphorized copper or nickel sulfamate), the interface member 700 can prevent the particles generated by the anodes from reaching the plating surface of the workpiece.

In alternate embodiments in which the interface member 700 is an ion-membrane, the interface member 700 can be permeable to preferred ions to allow these ions to pass through the interface member 700 and into the primary fluid flow $F_p$. One suitable ion-membrane is NAFION® perfluorinated membranes manufactured by DuPont®. In one application for copper plating, a NAFION 450 ion-selective membrane is used. Other suitable types of ion-membranes for plating can be polymers that are permeable to many cations, but reject anions and non-polar species. It will be appreciated that in electropolishing applications, the interface member 700 may be selected to be permeable to anions, but reject cations and non-polar species. The preferred ions can be transferred through the ion-membrane interface member 700 by a driving force, such as a difference in concentration of ions on either side of the membrane, a difference in electrical potential, or hydrostatic pressure.

Using an ion-membrane that prevents the fluid of the electroprocessing solution from passing through the interface member 700 allows the electrical current to pass through the interface member while filtering out particles, organic additives and bubbles in the fluid. For example, in plating applications in which the interface member 700 is permeable to cations, the primary fluid flow $F_p$ that contacts the workpiece can be a catholyte and the secondary fluid flow $F_2$ that does not contact the workpiece can be a separate anolyte because these fluids do not mix in this embodiment. A benefit of having separate anolyte and catholyte fluid flows is that it eliminates the consumption of additives at the anodes and the need to replenish the additives as often. Additionally, this feature combined with the "virtual electrode" aspect of the reaction vessel 204 reduces the need to "burn-in" anodes for insuring a consistent black film over the anodes for predictable current distribution because the current distribution is controlled by the configuration of the field shaping unit 500. Another advantage is that it also eliminates the need to have a predictable consumption of additives in the secondary flow $F_2$ because the additives to the secondary flow $F_2$ do not effect the primary fluid flow $F_p$ when the two fluids are separated from each other.

Referring to FIG. 8 again, the interface assemblies 710a–d are generally installed so that the interface members 700a–d are vertical or at least at an upwardly inclined angle relative to horizontal. The vertical arrangement of the interface assemblies 710a–d is advantageous because the interface members 700 force the bubbles to rise so that they can escape through the holes 522 in the walls 510a–d (FIG. 6). This prevents aggregations of bubbles that could potentially disrupt the electrical field from an individual anode.

From time to time, it may be desirable to modify a particular reaction vessel 204 from a first configuration for processing a first type of workpiece 5 to a second configuration for processing a different second type of workpiece 5. For example, a reaction vessel 204 adapted to treat a first size of workpiece, e.g., to electroplate a semiconductor wafer having a 300 mm diameter, is not well suited to treat differently sized workpieces, e.g., to electroplate 200 mm semiconductor wafers, to yield consistent, high-quality products. The two types of workpieces need not be different shapes to merit alteration of the electric field and/or flow pattern of processing fluid. For example, the workpieces may require plating of a different material or a different thickness of the same material, or the workpieces' surfaces may have different conductivities.

One embodiment of the present invention provides a reaction vessel 204 which can be easily modified to treat different workpieces and which can be easily disassembled for access to the electrodes 600 therein. In this embodiment, at least the virtual electrode unit 530 of the field shaping unit 500 can be easily removed from the reaction vessel 204 and replaced with a different virtual electrode unit adapted for treating a different workpiece.

As seen in FIGS. 6 and 8, the outer partition 530d may simply rest atop the upper edge of the outer wall 222 of the reaction vessel 204 without being securely affixed thereto. As noted above, each of the individual partitions 530a–d may be joined together, enabling the virtual electrode unit 530 to be removed from the reaction vessel 204 as a unit rather than separately as discrete elements. In the particular embodiment shown in FIG. 6, an upper edge of each of the walls 510a–d is coupled to a separate partition 530a–d, respectively, and the lower edge of each of the walls 510 may be releasably received in an annular recess 314 in the distributor 300. The walls 510 may also be slidably received in annular spaces between adjacent pairs of electrodes 600, as noted above. As a consequence, the entire field shaping unit 500, not just the virtual electrode unit 530, may be removed from the reaction vessel as a unit.

Figure 11:
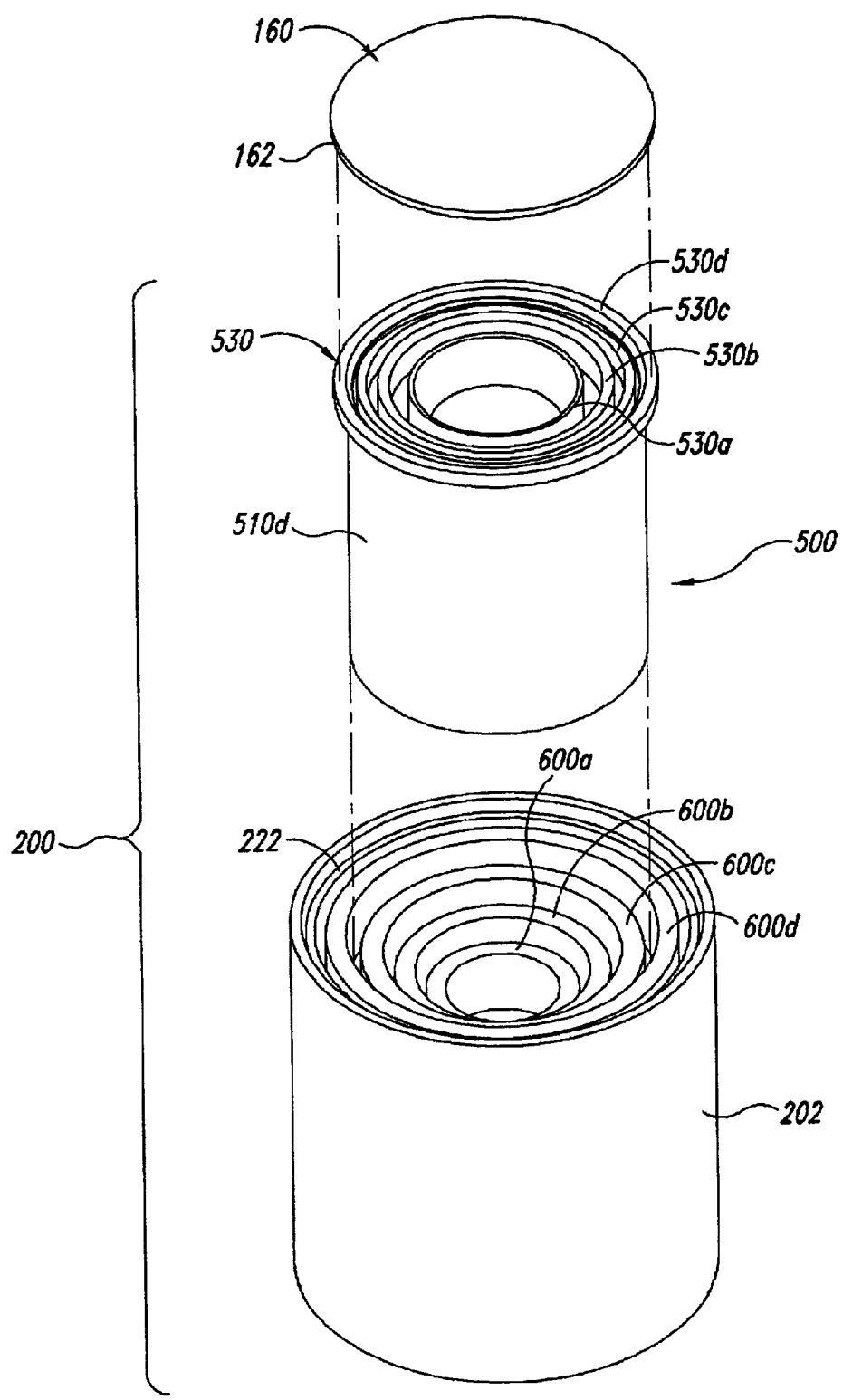
FIG. 11 is an isometric view schematically showing removal of a field shaping unit from the processing chamber of FIG. 6.

FIG. 11 illustrates removal of the field shaping unit 500 from the reaction vessel 204. As can be seen in this view, the virtual electrode unit 530 and the walls 510 (only the outer wall 510d being visible in FIG. 11) of the field shaping unit 500 are removed from the reaction vessel 204 as a unit. The electrodes 600 remain in place in the reaction vessel, supported by the pillars (602 in FIG. 6). Removing the field shaping unit 500 in this fashion allows ready access to the electrodes, e.g., for periodic inspection and maintenance or for scheduled replacement of consumable anodes. It also permits replacement of the field shaping unit 500 with a different field shaping unit better adapted for use with a different workpiece.

Figure 12:
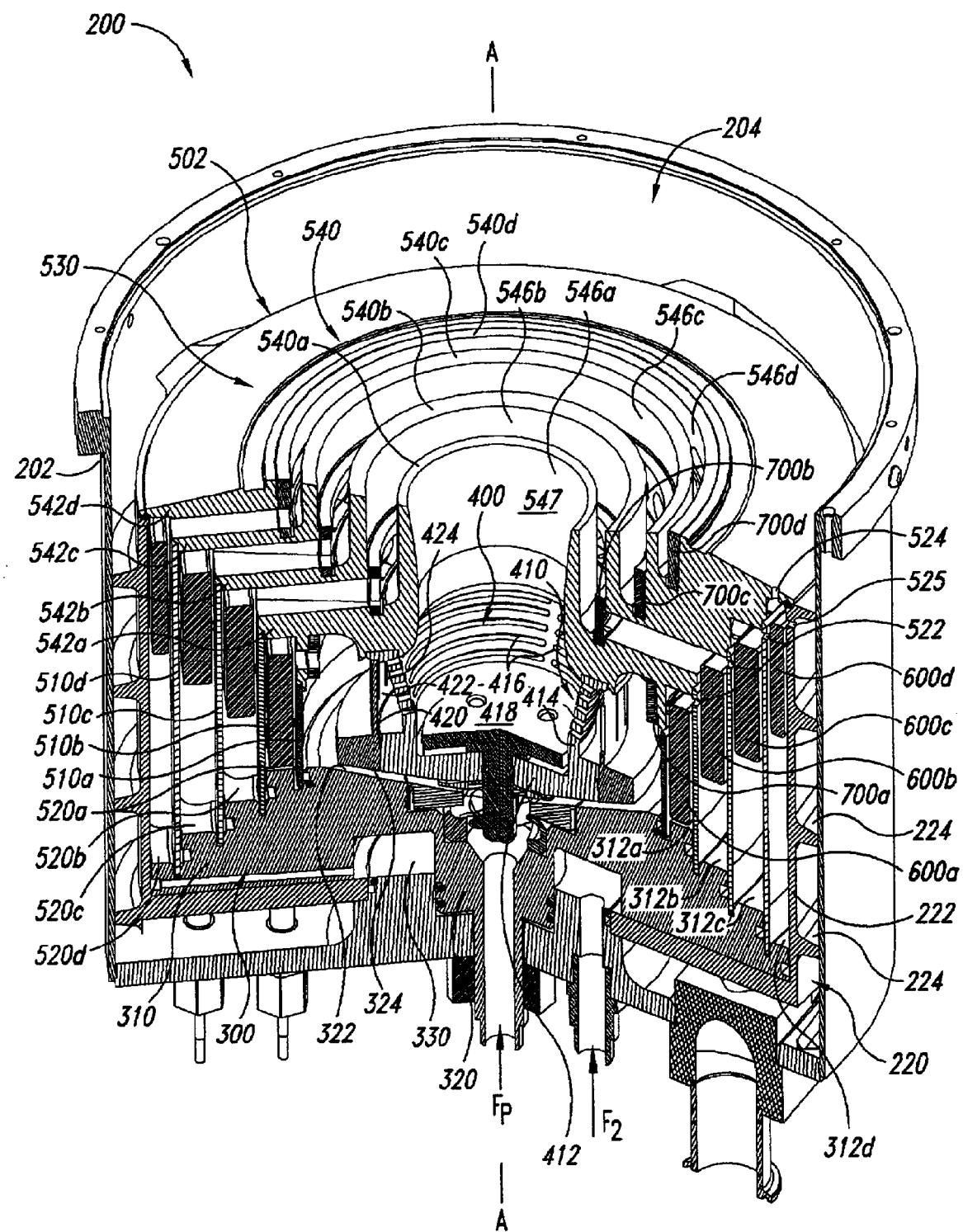
FIG. 12 is an isometric view similar to FIG. 6, showing a cross-sectional portion of a processing chamber modified in accordance with another embodiment of the invention.
Figure 13:
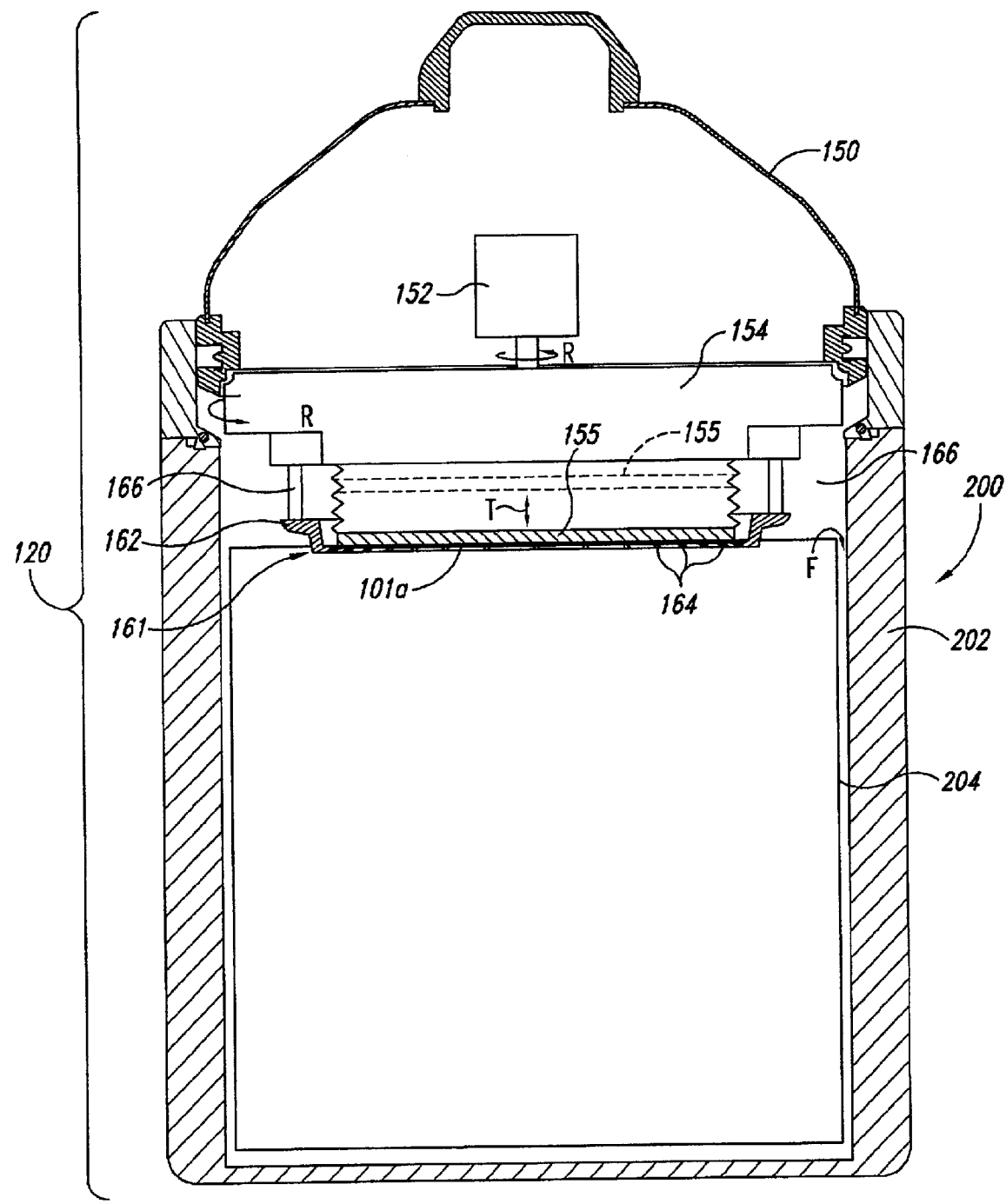
FIG. 13 is a schematic cross-sectional view of the electroprocessing station of FIG. 3 modified to process a differently-sized workpiece.

FIG. 12 is an isometric view of an embodiment of the processing chamber 200 with a different virtual electrode unit 540 therein. Many features of the processing chamber 200 shown in FIG. 12 can be the same as those described above with reference to FIG. 6, and thus like reference numbers refer to like parts in these Figures. The primary difference between the embodiment of FIG. 6 and the embodiment of FIG. 12 is that the virtual electrode unit 540 in FIG. 12 defines a different flow pattern than does the virtual electrode unit 530 of FIG. 6.

The general structure of the virtual electrode units 530 and 540 are similar. Hence, the virtual electrode unit 540 of FIG. 12 includes first-fourth partitions 540a–540d, respectively. The first partition 540a can have a first section 542a coupled to the second wall 510b, a skirt 544 depending downward above the first wall 510a, and a lip 546a projecting upwardly. The lip 546a has an interior surface 547 that directs the primary flow $F_p$ exiting from the primary flow guide 400. The second partition 540b can have a first section 542b coupled to the third wall 510c and a lip 546b projecting from the first section 542b, the third partition 540c can have a first section 542c coupled to the fourth wall 510d and a lip 546c projecting upward from the first section 542c, and the fourth partition 540d can have a first section 542d which engages the outer wall 222 of the container 220 and a lip 546d projecting from the first section 542d. As with the virtual electrode unit 530 described above, the partitions 540a–d may be joined together so the virtual electrode unit 540 can be removed from the reaction vessel as a unit. In the particular embodiment shown in FIG. 12, the first sections 542a–d of the partitions 540a–d are annular horizontal members and each of the lips 546a–d are annular vertical members that are arranged concentrically.

The two virtual electrode units 530 and 540 functionally differ in that the partitions 540a–d in FIG. 12 define gaps between adjacent lips 546 having different relative positions with respect to the common axis A—A from the gaps defined between adjacent lips 536 of the partitions 530a–d in FIG. 6. As explained above, these gaps may define the discharge outlets for the processing fluid and, hence, the relative positions and sizes of the virtual electrodes. As a practical matter, these virtual electrodes define the shape of the electrical field in the processing fluid. As a consequence, replacing the virtual electrode unit 530 of FIG. 6 with the virtual electrode unit 540 of FIG. 12 will alter the effective electrical field adjacent the workpiece. Comparing FIGS. 6 and 12, it can be seen that the first sections 542a–d and lips 546a–d of partitions 540a–d in FIG. 12 are longer than the first sections 532a–d and lips 536a–d of partitions 530 a–d in FIG. 6. As a result, the virtual electrodes defined by the virtual electrode unit 540 are positioned higher within and closer to the common axis A—A of the reaction vessel 204 than the virtual electrodes of FIG. 6. The processing chamber 200 of FIG. 12 with virtual electrode unit 540 may be better adapted for use with a smaller workpiece than is the processing chamber 200 of FIG. 6 with virtual electrode unit 530.

The walls 510 in FIG. 12 are received in the same spaces between adjacent electrodes 600 as are the walls 510 in FIG. 6. In one embodiment, the virtual electrode units 530 and 540 merely abut the walls 510, but the walls 510 remain in place when either of the virtual electrode units are removed. In such an embodiment, the virtual electrode units 530 and 540 may have recesses or abutments at the same relative positions so that they will abut the upper edges of the walls 510 when one virtual electrode unit replaces the other. This enables one to alter the electric field in the processing chamber 200 without altering any other parts of the processing chamber. In an alternative embodiment, the walls 510 are coupled to the virtual electrode unit 540 and the field shaping unit 502 may be removed as a unit. This would be directly analogous to the embodiment shown in FIG. 11, with the field shaping unit 502 of FIG. 12 being readily substitutable for the field shaping unit 500 of FIG. 6. To ensure that the walls 510 are properly arranged to be received in the annular spaces between adjacent electrodes 600, the relative positions of the walls 510 of the field shaping unit 502 (FIG. 12) may be the same as the relative positions of the walls 510 of the field shaping unit 500 (FIG. 6).

C. Methods of Treating Different Workpieces with the Same Electrochemical Processing Chamber As noted above, certain embodiments of the present invention provide methods enabling a single electrochemical processing chamber to be used to treat different workpieces. In the following discussion of different embodiments of these methods, reference is made to the processing chambers 200 shown in FIGS. 6 and 12. It should be understood that this is solely for purposes of convenience, however, and that various methods of the invention may be carried out with processing chambers which differ from those illustrated in these drawings or which do not include all of the detailed features shown in the drawings.

One embodiment of the invention provides a method for modifying an electrochemical processing chamber 200 from a first configuration for treating a first workpiece 101 (shown in FIG. 3) to a second configuration for treating a different second workpiece 101a (shown in FIG. 13). The second workpiece 101a may differ from the first in terms of size (as in the illustrated embodiment), electrical properties, or a variety of other features, as noted above. An electrochemical processing chamber 200 is initially configured to treat the first workpiece 101. For example, the electrochemical processing chamber 200 of FIG. 6 may include a first virtual electrode unit 530 which defines a plurality of virtual electrodes sized and positioned to electroplate a metal on a particular type of workpiece, e.g., a 300 mm semiconductor wafer. One of these workpieces will be positioned in the contact assembly 160 (FIG. 3) and the contact assembly 160 may be positioned over the reaction vessel 204 with a surface of the workpiece in contact with a processing solution in the reaction vessel 204. The workpiece may then be treated with the electrochemical processing chamber 200. When using the apparatus shown in FIG. 6, this could include delivering a primary fluid flow $F_p$ through the first inlet 320 and delivering a secondary fluid flow $F_2$ through the plenum 330. An electrical potential may be applied to the electrodes 600 and the secondary fluid flow $F_2$ may pass through the electrode compartments 320a–d, through the discharge openings defined by the virtual electrode unit 530, and into electrical contact with the primary fluid flow $F_p$.

After the first workpiece 101 is treated, the electrochemical processing chamber 200 may be modified to treat a different second workpiece 101a, e.g., a 200 mm semiconductor wafer. As suggested in FIG. 11, this may be achieved by lifting the contact assembly 160 and removing the initial virtual electrode unit 530 of FIG. 6 from the reaction vessel 204. Thereafter, a different virtual electrode unit 540 (FIG. 12) may be installed in the reaction vessel. In one embodiment, the initial virtual electrode unit 530 is removed as a unit, but the walls 510 remain in place. The second virtual electrode unit 540 may then be installed by placing it atop the upper edges of the same walls 510. In an alternative embodiment, the walls 510 are coupled to the first virtual electrode unit 530 and the entire field shaping unit 500 of FIG. 6 is removed as a unit. Thereafter, the second field shaping unit 502 may be installed in the reaction vessel 204, yielding an electrochemical processing chamber 200 essentially as shown in FIG. 12. When installing the second field shaping unit 502 in the reaction vessel 204, the walls 510 of the second field shaping unit 502 may be inserted in the annular spaces between adjacent electrodes previously occupied by the walls 510 of the first field shaping unit 500. Similarly, the lower edges of the walls 510 of the second field shaping unit 502 may be positioned in the annular recesses 314 in the distributor 310 previously occupied by lower edges of the walls 510 of the first field shaping unit 500.

After the electrochemical processing chamber 200 has been adapted for treating the second type of workpiece, one of the second workpieces may be treated with the modified electrochemical processing chamber 200. The process may substantially parallel that outlined above in connection with treating the first workpiece. Depending on the nature of the contact assembly 160 being used and the differences between the workpieces, it may be necessary to replace the contact assembly 160 used to treat the first workpiece 101 with a different contact assembly 161 better suited to handle the second type of workpiece 101a. FIG. 13 schematically illustrates the electrochemical processing chamber of FIG. 3 modified for use with a smaller second workpiece 101a. In FIG. 13, the contact assembly 160 of FIG. 3 has been replaced with a smaller contact assembly 161 sized to accommodate the smaller workpiece 101a carried thereby. The rotor 154 and backing plate 155 of FIG. 3 may also replaced with like components better adapted to mate with the smaller contact assembly 161. Once the second workpiece 101a is properly positioned in an appropriate contact assembly 161, the contact assembly 161 may be positioned over the reaction vessel 204 with a surface of the workpiece in contact with a processing solution, the primary and secondary fluid flows $F_p$ and $F_2$ may be established and power may be applied to the electrodes 600, as outlined above in connection with treatment of the first workpiece.

As noted above, the virtual electrodes defined by the first virtual electrode unit 530 (FIG. 6) may be sized and shaped to optimize electrochemical processing for the first workpiece and the virtual electrodes defined by the second virtual electrode unit 540 (FIG. 12) may be sized and shaped to optimize electrode chemical processing for the second workpiece. Simply by replacing the first field shaping unit 500 with the second field shaping unit 502 thereby permits the same electrochemical processing chamber 200 to be optimized for treating two different workpieces without necessitating modification of the electrodes 600 in the reaction vessel 204. This is indirect contrast to conventional single wafer processing chambers 1 such as that shown in FIG. 1, wherein attempting to adapt the processing chamber for use with differently sized workpieces would necessitate significant modifications. These modifications would include removing the anode 4 and primary flow guide 6 and replacing them with new, different parts. The electrical connection of the anode 4 to its power supply can complicate this exchange, particularly as compared to the simple modification process afforded by this embodiment of the present invention.

Another embodiment of the present invention permits a manufacturer to effectuate electrochemical treatment of two different workpieces by providing an initial electrochemical processing chamber 200 and a second virtual electrode unit 540 and giving the user appropriate instructions. The initial electrochemical processing chamber 200 may be substantially the same as that shown in FIG. 6 and include a virtual electrode unit 530 optimized for treating the first workpiece. The second virtual electrode unit 540 may define virtual electrodes having predefined relative positions optimized for treating the second workpiece. The user may be instructed to treat the first workpiece with the initial electrochemical processing chamber 200; to replace the first virtual electrode unit 530 with the second virtual electrode unit 540, thereby modifying the initial electrochemical processing chamber by repositioning the virtual electrodes without necessity of altering the electrodes of the reaction vessel; and to treat the second workpiece with the modified electrochemical processing chamber. The user may be instructed in any appropriate way. This may include written communication such as a written instruction manual, hands-on training, and/or videotaped instruction, for example.

An alternative embodiment of the invention provides a method of effectuating assembly of an electrochemical processing chamber 200. This embodiment includes providing a reaction vessel 204 having an outer wall 222, a plurality of electrodes (e.g., 600a and 600b), and a wall-receiving space between adjacent electrodes. A replaceable first field shaping unit (e.g., the field shaping unit 500 of FIG. 6) is provided. The first field shaping unit 500 has at least one wall (e.g., wall 510b) adapted to be received in the wall-receiving space between the electrodes 600. The first field shaping unit has a first virtual electrode unit 530 coupled to the wall 510. The first virtual electrode unit 530 defines a first set of virtual electrodes (e.g., $VE_1$ and $VE_2$) having predefined relative positions. A second field shaping unit 500 (e.g., the one shown in FIG. 8) is provided, with the second field shaping unit 500 also having at least one wall (e.g., wall 510b) adapted to be received in the wall-receiving space between the electrodes 600. The second field shaping unit 500 has a second virtual electrode unit 540 coupled to the wall 510 and defining a second set of virtual electrodes (e.g., $VE_1$ and $VE_2$) having predefined relative positions.

At least one functional characteristic of the first field shaping unit 500 is identified and at least one functional characteristic of the second field shaping unit 500 is identified. The identified functional characteristic of the first field shaping unit 500 is different from the identified functional characteristic of the second field shaping unit 500. For example, the first field shaping unit 500 may be identified as being adapted for use with a particular size of workpiece, such as a 300 mm semiconductor wafer, and the second field shaping unit may be identified as being adapted for use with a different size of workpiece, such as a 200 mm semiconductor wafer. This identifying information may enable a user to select between the first and second field shaping units to adapt the reaction vessel to treat a selected type of workpiece.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method of modifying an electrochemical processing chamber from a first configuration for treating a first workpiece to a second configuration for treating a different second workpiece, the electrochemical processing chamber initially comprising a reaction vessel having a plurality of electrodes positioned in electrically separate electrode compartments and a first virtual electrode unit defining a first set of virtual electrodes having predefined relative positions adapted for treating the first workpiece, each of the virtual electrodes being in fluid communication with one of the electrode compartments, the method comprising:

providing a second virtual electrode unit defining a second set of virtual electrodes having predetermined relative positions adapted for treating the second workpiece, the relative positions of the virtual electrodes in the first set differing from the relative positions of the virtual electrodes in the second set; and replacing the first virtual electrode unit with the second virtual electrode unit, thereby modifying an effective electric field of the electrochemical processing chamber for treatment of the second workpiece without necessitating modification of the electrodes.

2. The method of claim 1 wherein the electrode compartments are defined by a first plurality of walls which are coupled to the first virtual electrode unit, the first plurality of walls and the first virtual electrode unit together defining a first field shaping unit, replacing the first virtual electrode unit with the second virtual electrode unit comprising removing the first field shaping unit as a unit.

3. The method of claim 2 wherein the second virtual electrode unit is coupled to a second plurality of walls, the second plurality of walls and the second virtual electrode unit together defining a second field shaping unit, relative positions of the walls in the second field shaping unit being the same as relative positions of the walls in the first field shaping unit, replacing the first virtual electrode unit with the second virtual electrode unit further comprising, after removing the first field shaping unit, placing the second field shaping unit in the reaction vessel as a unit such that the walls of the second field shaping unit are positioned in the same locations formerly occupied by walls of the first field shaping unit.

4. The method of claim 1 wherein replacing the first virtual electrode unit with the second virtual electrode unit comprises removing the first virtual electrode unit and, thereafter, installing the second virtual electrode unit in its place.

5. The method of claim 1 further comprising treating the first workpiece with the electrochemical processing chamber prior to replacing the first virtual electrode unit with the second virtual electrode unit.

6. The method of claim 1 further comprising treating the second workpiece with the electrochemical processing chamber after replacing the first virtual electrode unit with the second virtual electrode unit.

7. The method of claim 1 wherein the reaction vessel includes a flow distributor having a separate fluid conduit in fluid communication with each of the electrode compartments and a separate annular recess for releasably receiving a lower edge of each wall, replacing the first virtual electrode unit with the second virtual electrode unit comprising removing the walls of the first partition from the annular recesses of the distributor.

8. The method of claim 7 wherein replacing the first virtual electrode unit with the second virtual electrode unit further comprises inserting a lower edge of each of the walls of the second virtual electrode unit in one of the annular recesses in the flow distributor.

9. The method of claim 1 wherein the electrochemical processing chamber initially includes a first contact assembly adapted to support the first workpiece in a predetermined position with respect to the first set of virtual electrodes, the method further comprising:

providing a second contact assembly adapted to support the second workpiece; and replacing the first contact assembly with the second contact assembly.

10. The method of claim 9 further comprising supporting the second workpiece with the second contact assembly and applying an electrical potential to the electrodes.

11. A method of treating a first workpiece and a different second workpiece in an electrochemical processing chamber, comprising:

providing an electrochemical processing chamber comprising a reaction vessel having a plurality of electrodes positioned in electrically separate electrode compartments and a first virtual electrode unit defining a first set of virtual electrodes having predefined relative positions adapted for treating the first workpiece, each of the virtual electrodes being in fluid communication with one of the electrode compartments;

providing a second virtual electrode unit defining a second set of virtual electrodes having predetermined relative positions adapted for treating the second workpiece, the relative positions of the virtual electrodes in the first set differing from the relative positions of the virtual electrodes in the second set;

treating the first workpiece by applying an electrical potential to the electrodes;

thereafter, replacing the first virtual electrode unit with the second virtual electrode unit, thereby modifying an effective electric field of the electrochemical processing chamber for treatment of the second workpiece without necessitating modification of the electrodes; and thereafter, treating the second workpiece by applying an electrical potential to the electrodes.

12. A method of treating a first workpiece and a different second workpiece in an electrochemical processing chamber, comprising:

providing an electrochemical processing chamber comprising a first contact assembly, a reaction vessel, an electrode received in an interior of the reaction vessel, and a first virtual electrode unit defining a first virtual electrode in fluid communication with the electrode;

providing a second contact assembly and a second virtual electrode unit defining a second virtual electrode;

supporting the first workpiece with the first contact assembly at a predetermined position with respect to the first virtual electrode;

treating the first workpiece by applying an electrical potential to the electrode:

thereafter, replacing the first virtual electrode unit with the second virtual electrode unit, thereby modifying an effective electric field of the electrochemical processing chamber for treatment of the second workpiece without necessitating modification of the electrodes;

supporting the second workpiece with the second contact assembly at a predetermined position with respect to the second virtual electrode; and thereafter, treating the second workpiece by applying an electrical potential to the electrode.

13. A method of effectuating electrochemical treatment of a first workpiece and a different second workpiece, comprising:

providing an initial electrochemical processing chamber and a second virtual electrode unit, the initial electrochemical processing chamber comprising a reaction vessel having a plurality of electrodes positioned in electrically separate electrode compartments and a first virtual electrode unit defining a first set of virtual electrodes having predefined relative positions adapted for treating the first workpiece, each of the virtual electrodes being in fluid communication with one of the electrode compartments;

the second virtual electrode unit being adapted to define a second set of virtual electrodes having predefined relative positions adapted for treating the second workpiece, each of the virtual electrodes at the second virtual electrode unit being adapted for fluid communication with one of the electrode compartments, relative positions of the virtual electrodes of the second field shaping unit being different from relative positions of the virtual electrodes of the first field shaping unit; and instructing a user to treat the first workpiece with the initial electrochemical processing chamber; to replace the first virtual electrode unit with the second virtual electrode unit, thereby modifying the initial electrochemical processing chamber by repositioning the virtual electrodes without necessity of altering the electrodes of the reaction vessel; and to treat the second workpiece with the modified electrochemical processing chamber.

14. The method of claim 13 wherein the electrode compartments in the initial electrochemical processing chamber are defined by a first plurality of walls coupled to the first virtual electrode unit and received in predefined spaces between adjacent electrodes, the first plurality of walls and the first virtual electrode unit together defining a first field shaping unit, instructing the user to replace the first field shaping unit with the second field shaping unit comprising instructing the user to remove the first field shaping unit.

15. The method of claim 14 wherein the second virtual electrode unit is coupled to a second plurality of walls, the second plurality of walls and the second virtual electrode unit together defining a second field shaping unit, instructing the user to replace the first virtual electrode unit with the second virtual electrode unit further comprising instructing the user to, after removing the first field shaping unit, place the second field shaping unit in the reaction vessel as a unit such that the walls of the second field shaping unit are positioned in the predefined spaces between adjacent electrodes.

16. The method of claim 13 wherein instructing the user to replace the first virtual electrode unit with the second virtual electrode unit comprises instructing the user to remove the first virtual electrode unit and, thereafter, installing the second virtual electrode unit in its place.

17. The method of claim 13 wherein the reaction vessel includes a flow distributor having a separate fluid conduit in fluid communication with each of the electrode compartments and a separate annular recess for releasably receiving a lower edge of each wall, instructing the user to replace the first virtual electrode unit with the second virtual electrode unit comprising instructing the user to remove the walls of the first partition from the annular recesses or the distributor.

18. The method of claim 17 wherein instructing the user to replace the first virtual electrode unit with the second virtual electrode unit further comprises instructing the user to insert a lower edge of each of the walls of the second virtual electrode unit in one of the annular recesses in the flow distributor.

19. A method of modifying an electrochemical processing chamber from a first configuration for treating a first workpiece to a second configuration for treating a different second workpiece, the electrochemical processing chamber in the first configuration comprising a reaction vessel having an interior, at least one electrode positioned in the interior, and a replaceable first virtual electrode unit above the electrode, the first virtual electrode unit defining at least two first virtual electrodes adapted for treating the first workpiece and in fluid communication with the at least one electrode, the method comprising:

providing a second virtual electrode unit which defines at least two second virtual electrodes adapted for treating the second workpiece;

without modifying the at least one electrode, removing the first virtual electrode unit from the reaction vessel; and without modifying the at least one electrode, installing the second virtual electrode unit in the reaction vessel to define the second configuration;

whereby the first virtual electrodes hate a first position relative to the electrochemical processing chamber in the first configuration and the second virtual electrodes have a second position relative to the electrochemical processing chamber in the second configuration, the first position differing from the second position.

20. A method of modifying an electrochemical processing chamber from a first configuration for treating a first workpiece to a second configuration for treating a different second workpiece, the electrochemical processing chamber in the first configuration comprising a reaction vessel and a replaceable first field shaping unit; the first field shaping unit having a plurality of concentric walls and a virtual electrode unit, the walls electrically separating a plurality of concentric electrode compartments and the virtual electrode unit defining a first set of virtual electrodes having predefined relative positions, a separate one of the virtual electrodes being in fluid communication with each of the electrode compartments; the reaction vessel comprising a wall defining an interior, the interior receiving the walls of the first field shaping unit and a plurality of electrodes at least one of the electrodes being positioned in each of the electrode compartments, adjacent electrodes being spaced from one another to define predefined spaces within which the walls are received; the method comprising:

providing a second field shaping unit having a plurality of concentric walls and a second virtual electrode unit, the second virtual electrode unit defining a second set of virtual electrodes having predetermined relative positions adapted for treating the second workpiece, the relative positions of the virtual electrodes in the second set differing from the relative positions of the virtual electrodes in the first set;

without modifying the electrodes, removing the first field shaping unit from the reaction vessel as a unit; and without modifying the electrodes, installing the second field shaping unit in the reaction vessel as a unit to define the second configuration, the walls of the second field shaping unit being received in the predefined spaces between the electrodes;

whereby the virtual electrodes occupy different relative positions in the first and second configurations of the electromechanical processing chamber.

\* \* \* \* \*

UNITED STATES PATENT AND TRADEMARK OFFICE
CERTIFICATE OF CORRECTION

PATENT NO. : 6,916,412 B2
DATED : July 12, 2005
INVENTOR(S) : Daniel J. Woodruff et al.

It is certified that error appears in the above-identified patent and that said Letters Patent is hereby corrected as shown below:

Column 26,
Line 59, replace colon with semicolon;

Column 27,
Line 19, "at the" should be -- of the --;
Line 57, "installing" should be -- install --;
Line 65, "or the distributor" should be -- of the distributor --;

Column 28,
Line 25, "hate" should be -- have --;
Line 65, "electromechanical" should be -- electrochemical --.

Signed and Sealed this

Eleventh Day of October, 2005

JON W. DUDAS
*Director of the United States Patent and Trademark Office*